US012575221B2

(12) United States Patent
Ota et al.

(10) Patent No.: US 12,575,221 B2
(45) Date of Patent: Mar. 10, 2026

(54) APPARATUS AND SYSTEM

(71) Applicant: CANON KABUSHIKI KAISHA, Tokyo (JP)

(72) Inventors: Yasuharu Ota, Tokyo (JP); Noriyuki Shikina, Tokyo (JP); Yu Maehashi, Hokkaido (JP)

(73) Assignee: Canon Kabushiki Kaisha, Tokyo (JP)

( * ) Notice: Subject to any disclaimer, the term of this patent is extended or adjusted under 35 U.S.C. 154(b) by 21 days.

(21) Appl. No.: 18/812,808

(22) Filed: Aug. 22, 2024

(65) Prior Publication Data

US 2025/0081670 A1 Mar. 6, 2025

(30) Foreign Application Priority Data

Aug. 28, 2023 (JP) ................................. 2023-138000

(51) Int. Cl.
| | |
|---|---|
| *H10F 77/00* | (2025.01) |
| *H04N 25/47* | (2023.01) |
| *H04N 25/76* | (2023.01) |

(52) U.S. Cl.
CPC ........... *H10F 77/959* (2025.01); *H04N 25/47* (2023.01); *H04N 25/7795* (2023.01)

(58) Field of Classification Search
CPC .. H10F 77/959; H04N 25/47; H04N 25/7795; H04N 23/74; H04N 23/555; H04N 23/56; H04N 25/773; H04N 25/70; H04N 25/79; A61B 1/005; A61B 1/04; A61B 1/06; A61B 17/00234; A61B 2017/00296; G01J 1/0228; G01J 1/44; G01J 2001/4466

USPC .......................................................... 348/308
See application file for complete search history.

(56) References Cited

U.S. PATENT DOCUMENTS

| | | | | |
|---|---|---|---|---|
| 11,402,264 | B2 * | 8/2022 | Ota ..................... | H04N 25/709 |
| 2020/0174105 | A1 * | 6/2020 | Yin ....................... | G01S 7/4914 |
| 2020/0244909 | A1 * | 7/2020 | Morimoto ............. | H10F 77/953 |
| 2021/0151481 | A1 * | 5/2021 | Maehashi .............. | H04N 25/60 |
| 2021/0168323 | A1 * | 6/2021 | Ikedo .................... | H04N 25/60 |

FOREIGN PATENT DOCUMENTS

| | | |
|---|---|---|
| JP | 2020123846 A | 8/2020 |
| JP | 2023059522 A | 4/2023 |

* cited by examiner

*Primary Examiner* — Lin Ye
*Assistant Examiner* — Chan T Nguyen
(74) *Attorney, Agent, or Firm* — Canon U.S.A., Inc. IP Division

(57) ABSTRACT

An apparatus includes a photodiode that performs avalanche multiplication, a recharging circuit, a control signal generating circuit that generates a control signal to control the recharging circuit, a count pulse generating circuit that generates a pulse signal from a signal output from the photodiode, and a counter that counts the pulse signal output from the count pulse generating circuit. The control signal generating circuit is configured to output, based on a clock signal and a mask signal, the control signal having a first period and the control signal having a second period longer than the first period. In a case where a counted value of the counter reaches a threshold, the signal to be output from the control signal generating circuit can be switched from the control signal having the first period to the control signal having the second period.

19 Claims, 20 Drawing Sheets

INCIDENCE
OF PHOTON

VC

DETERMINATION
THRESHOLD

TIME t0　　t1 t2　　t3

VO

TIME

FIG. 8A
FIG. 8B
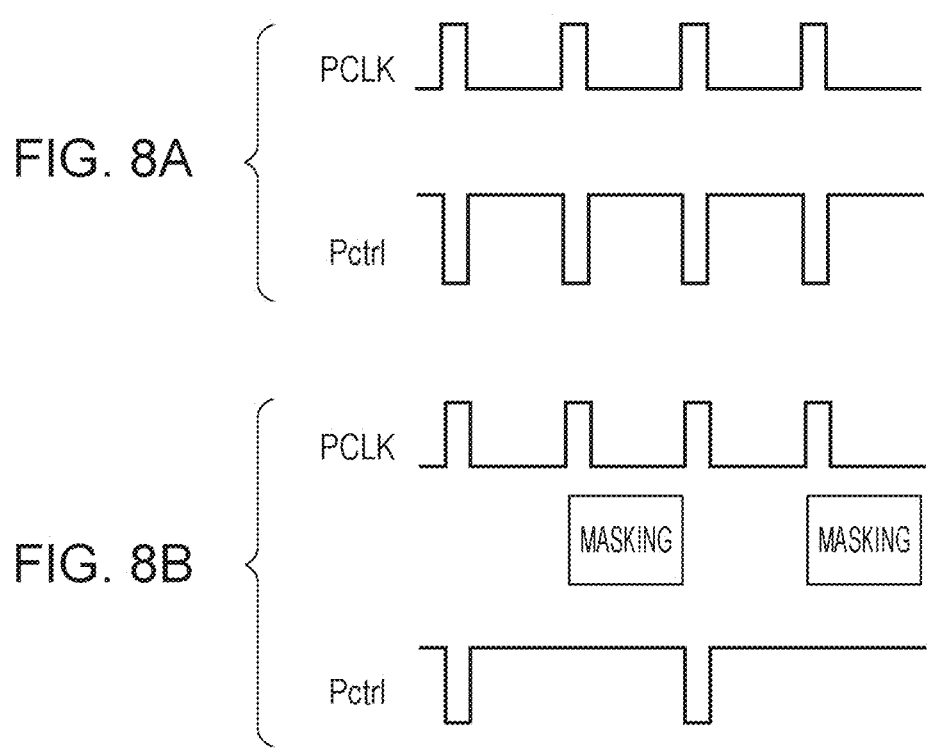
FIG. 8C
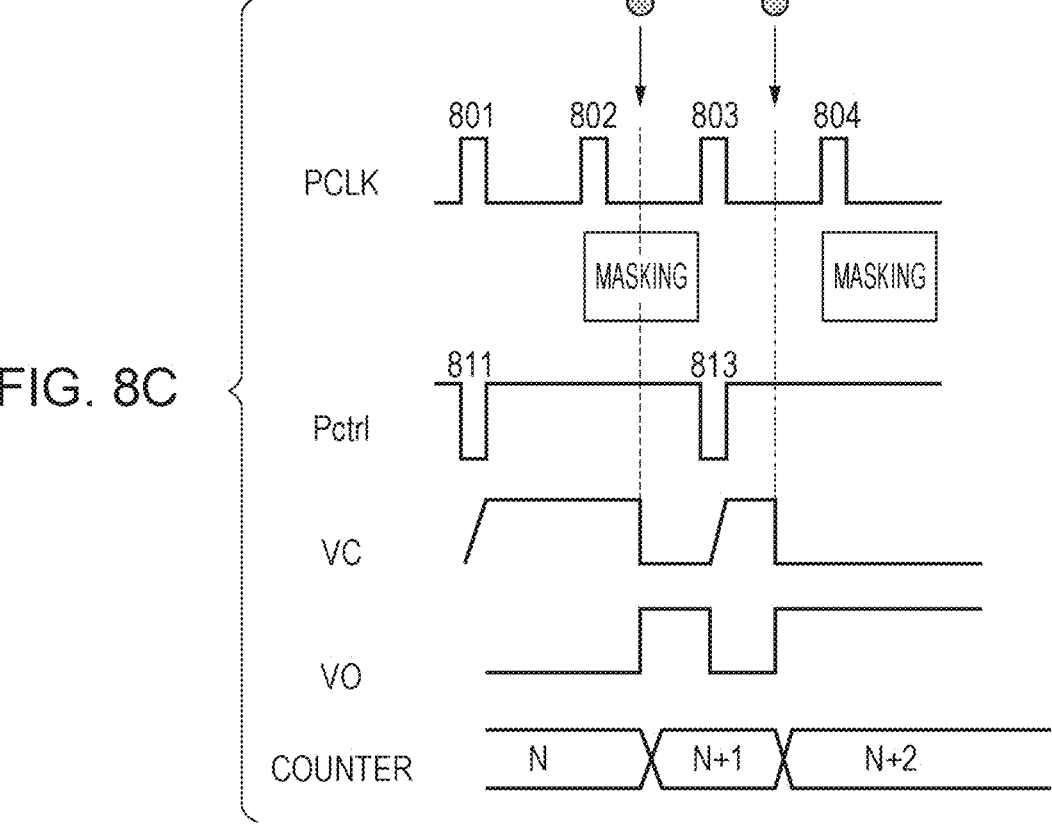

IMAGE CAPTURING APPARATUS — 2310

↓

IMAGE PROCESSING UNIT — 2312

↓

PARALLAX ACQUISITION UNIT — 2314

↓

DISTANCE ACQUISITION UNIT — 2316

↓

COLLISION DETERMINATION UNIT — 2318 ← VEHICLE INFORMATION ACQUISITION APPARATUS — 2320

2330

CONTROL ECU

2340

ALARM APPARATUS

APPARATUS AND SYSTEM

BACKGROUND

Technical Field

The aspect of the embodiments relates to an apparatus and a system.

Description of the Related Art

A light detecting apparatus is known, which uses an avalanche photodiode (APD) that can detect single-photon-level weak light using avalanche (electron avalanche) multiplication. In the APD, a first semiconductor region of a first conductivity type having the same polarity as that of signal charges and a second semiconductor region of a second conductivity type having a polarity different from that of the signal charges form a high electric field region (avalanche multiplication portion).

Japanese Patent Laid-Open No. 2020-123846 discloses a technique for suppressing power consumption by controlling a MOS transistor functioning as a passive quench circuit. Specifically, at the start time of an exposure period, the MOS transistor is turned on to enter an operation period (an inactive period is 0%) when the APD is constantly operated. Next, when a counted value becomes a threshold N1, a time period when the MOS transistor is off is provided and a time period when the MOS transistor is operated is set to half the operation period (the inactive period is 50%). Next, when the counted value becomes a threshold N2, a time period when the MOS transistor is operated is set to ¼ of the operation period (the inactive period is 75%). With this configuration, in a case where illuminance is high, the number of times that avalanche multiplication is performed is reduced. Therefore, it is possible to reduce power consumption of pixels.

It is possible to reduce power consumption by using the configuration described in Japanese Patent Laid-Open No. 2020-123846. However, in Japanese Patent Laid-Open No. 2020-123846, since the passive quench circuit is used, the relationship between the illuminance and the counted value may be reversed under a high-illuminance environment. In addition, when the illuminance is too high, no signal may be generated. Therefore, when the illuminance is high, an appropriate counted value may not be obtained and thus a dynamic range may be narrow.

SUMMARY

An apparatus includes: a photodiode control circuit including a photodiode that performs avalanche multiplication, a recharging circuit that switches between a first state in which the photodiode is connected to a power source and a second state in which the photodiode is not connected to the power source, and a control signal generating circuit that generates a control signal to control the recharging circuit; a count pulse generating circuit that generates a pulse signal from an output signal from the photodiode; and a counter that counts the pulse signal output from the count pulse generating circuit. The control signal generating circuit is configured to output, based on a clock signal and a mask signal, the control signal having a first period and the control signal having a second period longer than the first period. In a case where a counted value of the counter reaches a threshold, the signal to be output from the control signal generating circuit is switched from the control signal having the first period to the control signal having the second period.

Further features of the disclosure will become apparent from the following description of exemplary embodiments with reference to the attached drawings.

BRIEF DESCRIPTION OF THE DRAWINGS

FIGS. 8A, 8B, and 8C are diagrams for explaining an issue with a circuit that performs clock recharging driving.

FIG. 14 is a block diagram illustrating a configuration of a photoelectric conversion apparatus according to a third embodiment.

DESCRIPTION OF THE EMBODIMENTS

Figure 1:
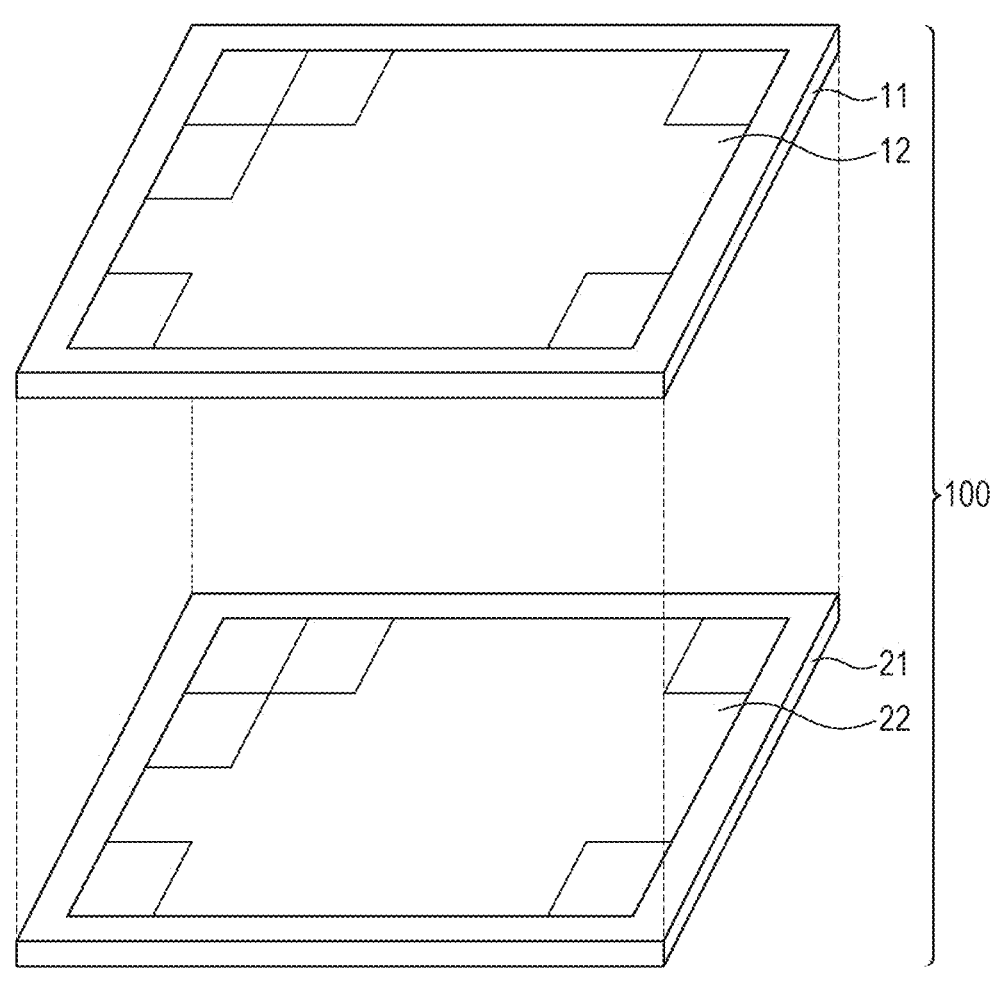
FIG. 1 is a diagram illustrating a configuration of a photoelectric conversion apparatus.

Embodiments described below are for embodying the technical idea of the disclosure and do not limit the disclosure. The sizes and positional relationships of members illustrated in the drawings may be exaggerated to clarify the description. In the following description, the same components are denoted by the same reference signs and description may be omitted. A configuration described in each of the embodiments can be replaced with and combined with one or more of configurations described in the other embodiments unless there is a technical issue.

The embodiments of the disclosure will be described below with reference to the drawings. In the following description, terms (e.g., "top", "bottom", "right", "left", and other terms including those terms) indicating specific directions and specific positions are used as necessary. Those terms are used to easily understand the aspect of the embodiments with reference to the drawings, and the technical scope of the aspect of the embodiments is not limited by the meanings of those terms.

In the following description, a connection between elements of a circuit may be described. In this case, even in a case where another element is interposed between the target elements, the target elements are treated as being connected to each other unless otherwise indicated herein.

In the following description, an anode of an avalanche photodiode (APD) is at a fixed electric potential, and a signal is taken out from the cathode side of the APD. Therefore, a semiconductor region of a first conductivity type in which electric charges of the same polarity as that of electric charges of a signal are majority carriers is an N-type semiconductor region, and a semiconductor region of a second conductivity type in which electric charges of a different polarity from that of the electric charges of the signal are majority carriers is a P-type semiconductor region.

The cathode of the APD may be at a fixed electric potential, and a signal may be taken out from the anode side of the APD. In this case, a semiconductor region of the first conductivity type in which electric charges of the same polarity as that of electric charges of a signal are majority carriers is a P-type semiconductor region, and a semiconductor region of the second conductivity type in which electric charges of a different polarity from that of the electric charges of the signal are majority carriers is an N-type semiconductor region. A case where one of the nodes of the APD is at a fixed electric potential will be described, but electric potentials of both of the nodes may vary.

FIG. 1 is a diagram illustrating a configuration of a lamination type photoelectric conversion apparatus 100. The photoelectric conversion apparatus 100 is formed by laminating two substrates, a sensor substrate 11 and a circuit substrate 21, and electrically connecting the sensor substrate 11 and the circuit substrate 21 to each other. The sensor substrate 11 includes a first semiconductor layer having photoelectric conversion elements 102 (described later), and a first wiring structure. The circuit substrate 21 includes a second semiconductor layer having circuits such as signal processing units 103 (described later) and the like, and a second wiring structure. The photoelectric conversion apparatus 100 is formed by laminating the second semiconductor layer, the second wiring structure, the first wiring structure, and the first semiconductor layer in this order. A photoelectric conversion apparatus described in each embodiment is a rear-surface irradiation type photoelectric conversion apparatus on which light is incident from a second surface and in which a circuit substrate is disposed on a first surface.

Although a case where the sensor substrate 11 and the circuit substrate 21 are diced chips is described below, the sensor substrate 11 and the circuit substrate 21 are not limited to chips. For example, each of the substrates may be a wafer. Alternatively, each of the substrates may be laminated on each other in a wafer form and diced. Each of the substrates may be formed into chips from a wafer form, and the chips may be laminated on and bonded to each other.

A pixel region 12 is arranged on the sensor substrate 11. A circuit region 22 in which a signal detected in the pixel region 12 is processed is arranged on the circuit substrate 21.

Figure 2:
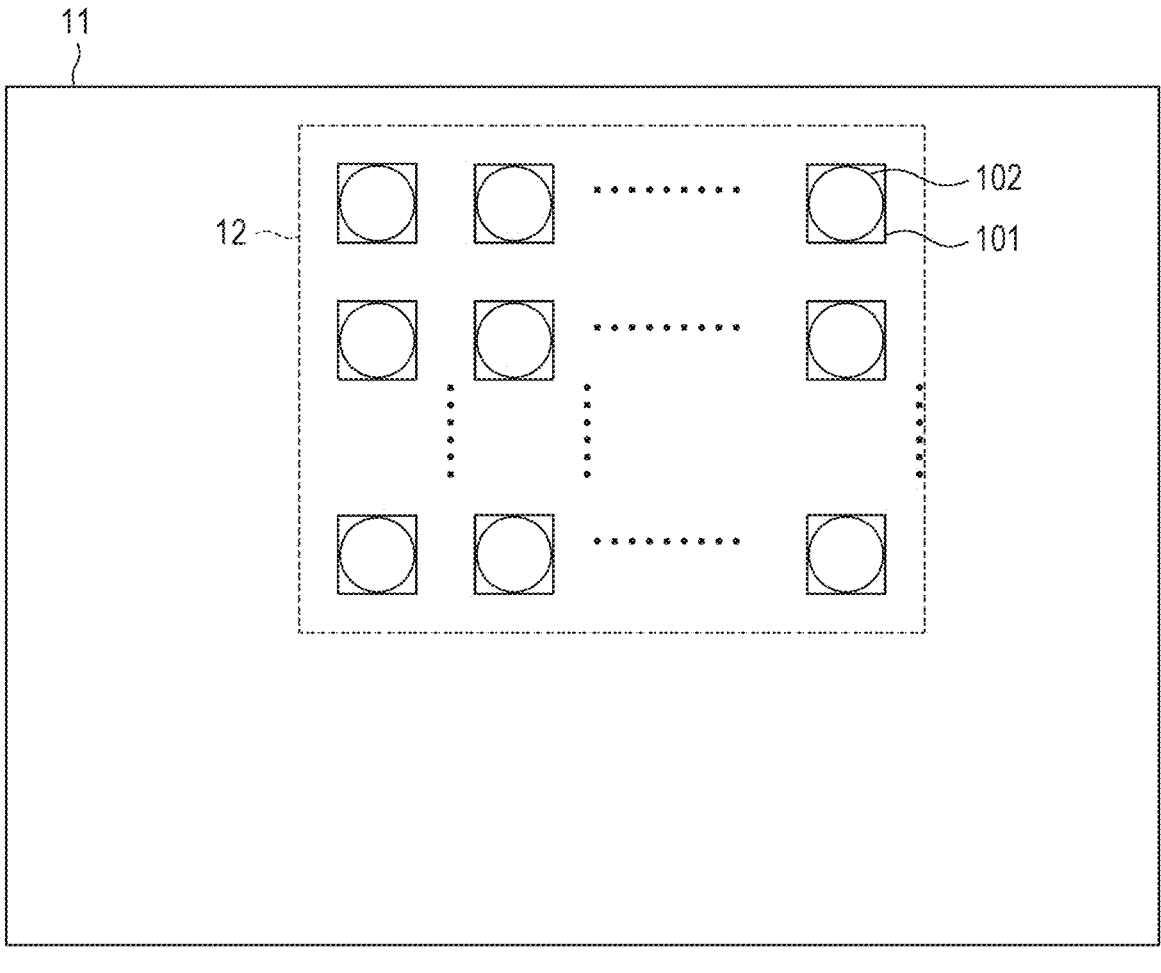
FIG. 2 is a diagram illustrating an example of an arrangement on a sensor substrate.

FIG. 2 is a diagram illustrating an example of an arrangement on the sensor substrate 11. Pixels 101 having the photoelectric conversion elements 102 including APDs are arranged in a two-dimensional array in plan view and form the pixel region 12.

The pixels 101 are typically pixels for forming an image, but may additionally have a time-of-flight (TOF) function.

Figure 3:
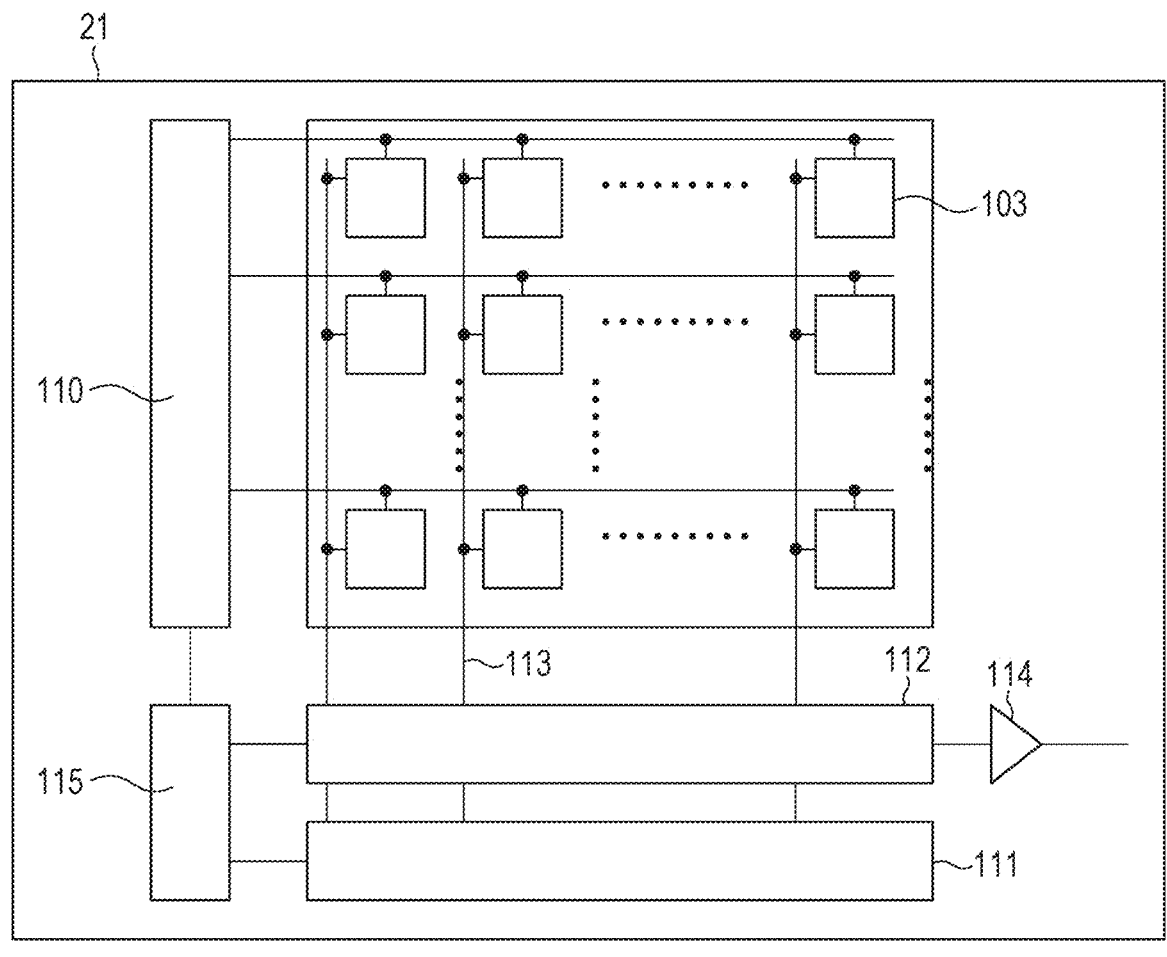
FIG. 3 is a diagram illustrating an example of an arrangement on a circuit substrate.

FIG. 3 is a diagram illustrating a configuration of the circuit substrate 21. The circuit substrate 21 includes the signal processing units 103, a reading circuit 112, a control pulse generation unit 115, a horizontal scanning circuit 111, signal lines 113, and a vertical scanning circuit 110. The signal processing units 103 process electric charges into which the photoelectric conversion elements 102 illustrated in FIG. 2 has photoelectrically converted light.

The photoelectric conversion elements 102 illustrated in FIG. 2 are electrically connected to the signal processing units 103 illustrated in FIG. 3 via connection wiring provided for each of the pixels.

The vertical scanning circuit 110 receives a control pulse supplied from the control pulse generation unit 115 and supplies the control pulse to each of the pixels. As the vertical scanning circuit 110, a logic circuit such as a shift register or an address decoder is used.

Signals output from the photoelectric conversion elements 102 of the pixels are processed by the signal processing units 103. The signal processing units 103 are provided with counters, memories, and the like, and digital values are written to and held in the memories.

The horizontal scanning circuit 111 transmits a control pulse for sequentially selecting each column to the signal processing units 103 in order to read signals from memories of the pixels in which digital signals are held.

For a selected column, signals are output to a signal line 113 from signal processing units 103 of pixels selected by the vertical scanning circuit 110.

The signals output to the signal line 113 are output via an output circuit 114 to a recorder or a signal processing unit present outside the photoelectric conversion apparatus 100.

In FIG. 2, the photoelectric conversion elements may be one-dimensionally arranged in the pixel region. Each of functions of the signal processing units may not be provided for a respective one of all of the photoelectric conversion elements. For example, a single signal processing unit may be shared by a plurality of photoelectric conversion elements and may process successive signals.

As illustrated in FIGS. 2 and 3, the plurality of signal processing units 103 is disposed in a region that overlaps the pixel region 12 in plan view. The vertical scanning circuit 110, the horizontal scanning circuit 111, the reading circuit 112, the output circuit 114, and the control pulse generation unit 115 are disposed so as to overlap a non-pixel region of the sensor substrate 11 between an end of the sensor substrate 11 and an end of the pixel region 12 in plan view. In other words, the sensor substrate 11 includes the pixel region 12 and the non-pixel region arranged around the pixel region 12. The vertical scanning circuit 110, the horizontal scanning circuit 111, the reading circuit 112, the output circuit 114, and the control pulse generation unit 115 are disposed in a region that overlaps the non-pixel region in plan view.

Figure 4:
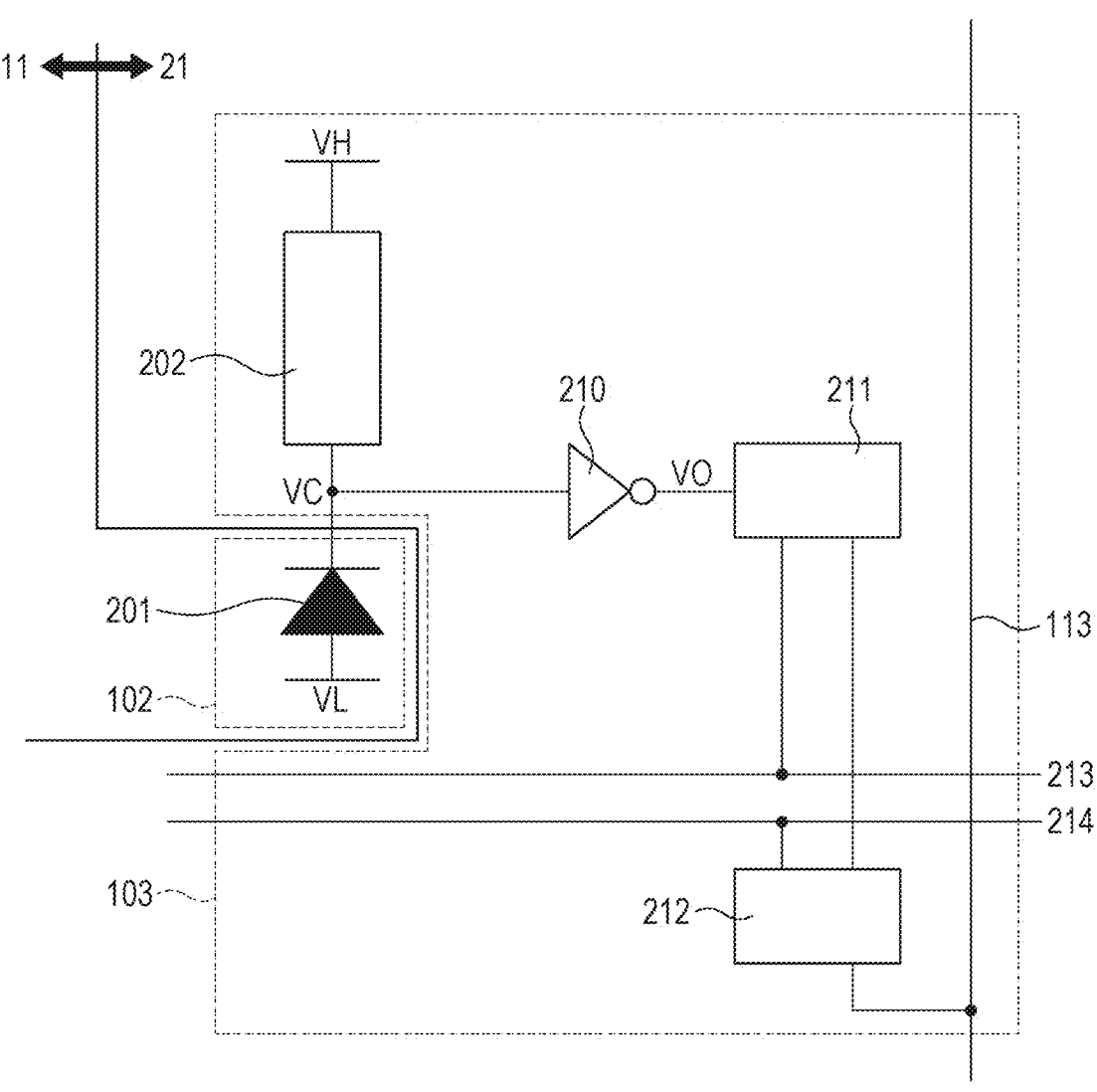
FIG. 4 is a block diagram illustrating an equivalent circuit of a photoelectric conversion element.

FIG. 4 is an example of a block diagram illustrating an equivalent circuit of FIGS. 2 and 3. FIG. 4 is a block diagram of a photoelectric conversion apparatus including a general APD.

In FIG. 4, a photoelectric conversion element 102 having the APD 201 is disposed on the sensor substrate 11, and other members are disposed on the circuit substrate 21.

The APD 201 generates a pair of electric charges according to incident light by photoelectric conversion. A voltage VL (first voltage) is supplied to the anode of the APD 201. A voltage VH (second voltage) higher than the voltage VL supplied to the anode is supplied to the cathode of the APD 201. A reverse bias voltage is supplied to the anode and the cathode such that the APD 201 performs an avalanche multiplication operation. In a state in which such a voltage is supplied, electric charges generated due to the incident light cause avalanche multiplication, and an avalanche current occurs.

In a case where the reverse bias voltage is supplied to the APD, the APD has a Geiger mode in which the APD operates in a state in which the difference in electric potential between the anode and the cathode of the APD is higher than a breakdown voltage, and a linear mode in which the APD operates in a state in which the difference in electric potential between the anode and the cathode of the APD is close to the breakdown voltage or equal to or lower than the breakdown voltage.

The APD that operates in the Geiger mode is referred to as a single-photon avalanche diode (SPAD). For example, the voltage VL (first voltage) is –30 V and the voltage VH (second voltage) is 3 V. The APD 201 may be operated in the linear mode or may be operated in the Geiger mode.

A quench element 202 is connected to the APD 201 and a power source which supplies the voltage VH. The quench element 202 functions as a load circuit (quench circuit) during signal multiplication caused by avalanche multiplication and has a function of suppressing a voltage to be supplied to the APD 201 and suppressing avalanche multiplication (quench operation). The quench element 202 has a function of returning the voltage to be supplied to the APD 201 to the voltage VH by causing a current corresponding to a voltage drop due to the quench operation (recharging operation) to flow.

A signal processing unit 103 includes a waveform shaping unit 210, a counter 211, and a selecting circuit 212.

In the present specification, the signal processing unit 103 may include any one of the waveform shaping unit 210, the counter 211, and the selecting circuit 212.

The waveform shaping unit 210 shapes a change in the electric potential of the cathode of the APD 201 and outputs a pulse signal. The electric potential of the cathode of the APD 201 changes when a photon is detected. As the waveform shaping unit 210, for example, a single inverter circuit is used. FIG. 4 illustrates an example in which a single inverter is used as the waveform shaping unit 210. However, as the waveform shaping unit 210, a circuit in which a plurality of inverters is connected in series to each other may be used or another circuit that has a waveform shaping effect may be used.

The counter 211 counts the number (number of times) of pulse signals output from the waveform shaping unit 210 and holds the counted value. When a control pulse pRES is supplied to the counter 211 through a drive line 213, a signal held in the counter 211 is reset.

A control pulse pSEL is supplied to the selecting circuit 212 from the vertical scanning circuit 110 illustrated in FIG. 3 through a drive line 214 (not illustrated in FIG. 3)

illustrated in FIG. 4 and the selecting circuit 212 switches whether to electrically connect the counter 211 to a signal line 113 or electrically disconnect the counter 211 from the signal line 113. The selecting circuit 212 includes, for example, a buffer circuit that outputs a signal.

A switch such as a transistor may be disposed between the quench element 202 and the APD 201 to switch whether to electrically connect the quench element 202 to the APD 201. A switch such as a transistor may be disposed between the photoelectric conversion element 102 and the signal processing unit 103 to switch whether to electrically connect the photoelectric conversion element 102 to the signal processing unit 103. Similarly, a switch such as a transistor may be used to electrically switch whether to supply the voltage VH or the voltage VL to the photoelectric conversion element 102.

Figures 5A, 5B, 5C:
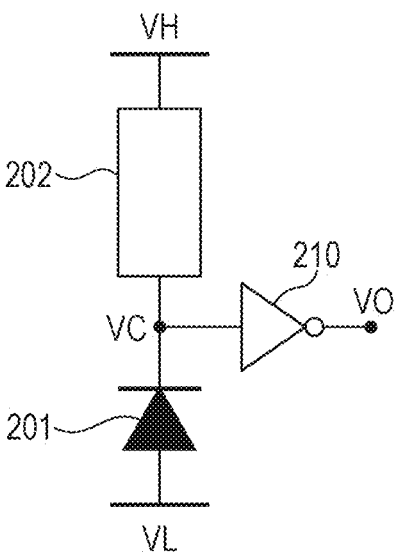
FIGS. 5A, 5B, and 5C are diagrams illustrating a relationship between an operation of an APD and an output signal.

FIGS. 5A, 5B, and 5C are diagrams schematically illustrating a relationship between an operation of the APD and an output signal.

FIG. 5A is a diagram illustrating the APD 201, the quench element 202, and the waveform shaping 210 taken from FIG. 4. The input side of the waveform shaping unit 210 is denoted by VC, while the output side of the waveform shaping unit 210 is denoted by VO. FIG. 5B illustrates a voltage at VC, and FIG. 5C illustrates a signal from VO.

In a time period from a time t0 to a time t1, a difference in electric potential that is VH-VL is applied to the APD 201 illustrated in FIG. 5A. When a photon is incident on the APD 201 at the time t1, avalanche multiplication occurs in the APD 201, an avalanche multiplication current flows in the quench element 202, and the voltage at VC drops. When the amount of the voltage drop further increases and the difference in electric potential applied to the APD 201 decreases, the avalanche multiplication in the APD 201 stops at a time t2 and the voltage level at VC does not become lower than a certain value. Thereafter, in a time period from the time t2 to a time t3, a current for compensating for the voltage drop from the voltage VL flows at VC, and VC is maintained at the original potential level at the time t3. In this case, a part that is included in an output waveform and exceeds a certain threshold at VC is shaped by the waveform shaping unit 210 and is output as the signal from VO.

The arrangement of the signal lines 113 and the arrangement of the reading circuit 112 and the output circuit 114 are not limited to those illustrated in FIG. 3. For example, the signal lines 113 may be disposed to extend in a row direction and the reading circuit 112 may be disposed in a region to which the signal lines 113 extend.

First Embodiment

Passive Recharging Circuit

Figures 6A, 6B:
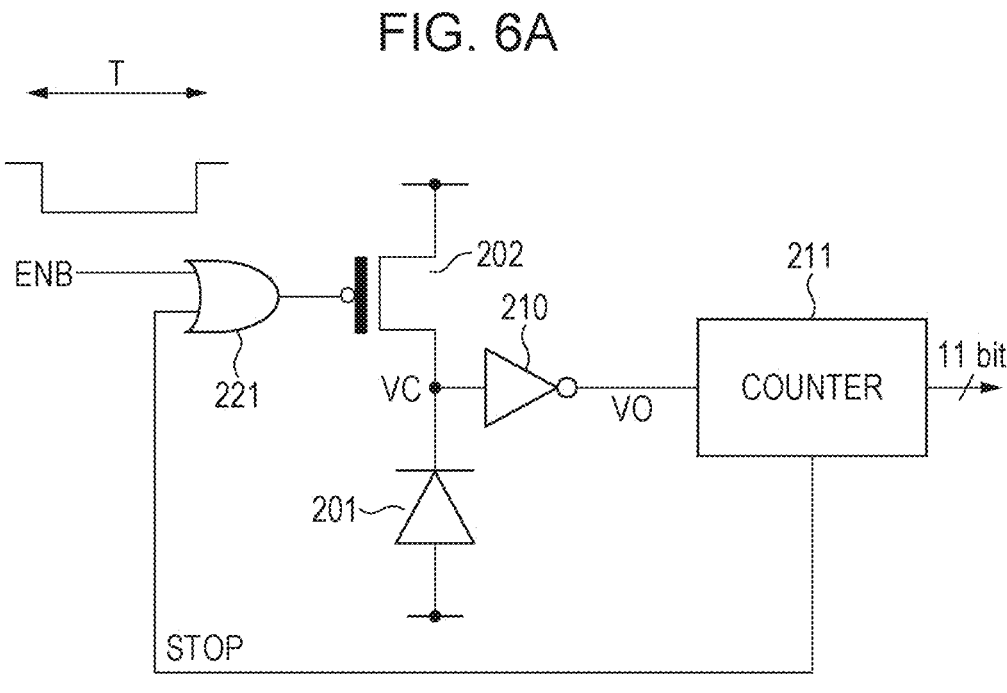
FIG. 6A is a block diagram and an equivalent circuit diagram of a pixel circuit according to a comparative example.
FIG. 6B is a block diagram and an equivalent circuit diagram of a pixel circuit according to each embodiment.

FIG. 6A is a block diagram and an equivalent circuit diagram of a pixel circuit for passive recharging according to a comparative example. The gate of a transistor which is the quench element 202 connected to the cathode side of the APD 201, and output of a logic circuit 221 (OR circuit) are the same node. The logic circuit 221 is configured such that a signal ENB and a signal STOP can be input to the logic circuit 221. The signal ENB is at a low (L) level (first level) for an exposure period T and is at a high (H) level (second level) for other periods. In this case, the L level is the first level and the H level is the second level. However, in a case where the conductivity type of the MOS transistor is different, the opposite relationship is established. Therefore, the H level may be the first level and the L level may be the second level.

In a case where the signal STOP is at the L level and the signal ENB is at the L level, the transistor that is the quench element 202 is on and in a recharged state. After a predetermined time period, the APD 201 goes into a standby state in which avalanche multiplication is possible. In a case where a signal pattern other than the pattern in which the signal STOP is at the L level and the signal ENB is at the L level occurs, the quench element 202 is turned off and the APD 201 goes into a non-standby state in which avalanche multiplication is not possible. The waveform shaping unit 210 includes the inverter, and the counter 211 is provided with a 11-bit flip-flop. For example, when the counted value of the counter 211 becomes 2047 which is the maximum counted value, the signal STOP transitions from the L level to the H level, and the transistor that is the quench element 202 is turned off. Therefore, even when the signal ENB becomes the L level, the quench element 202 continues to be off and the non-standby state of the APD 201 is maintained.

Figure 7A:
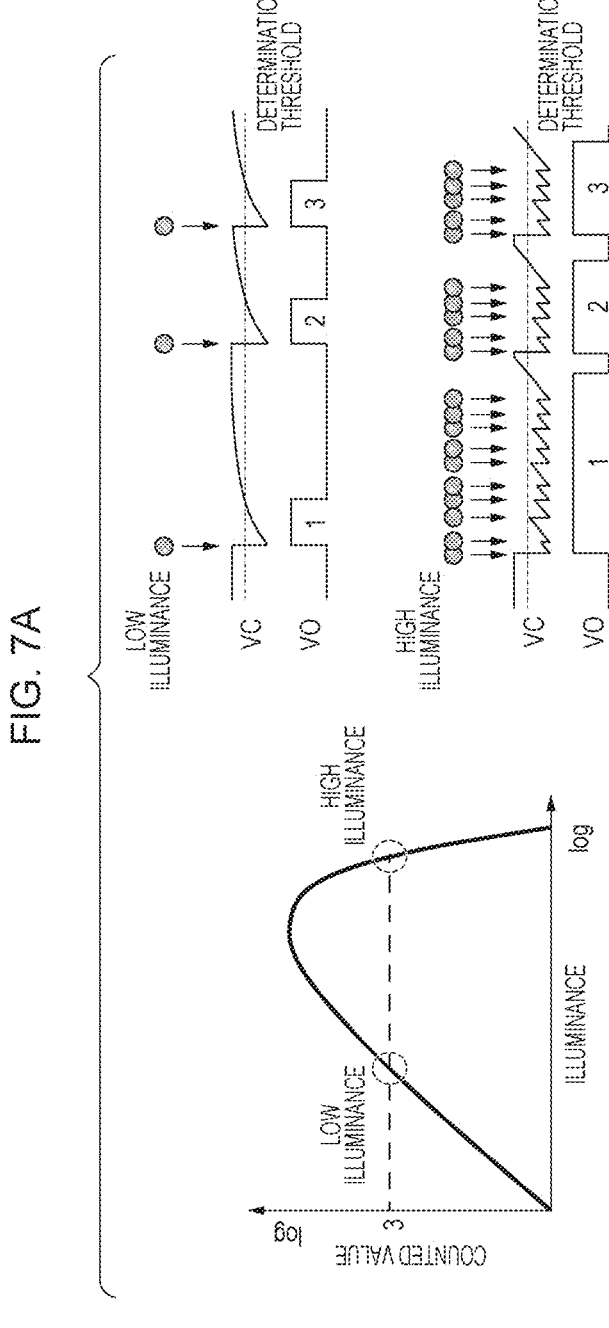
FIGS. 7A and 7B are diagrams illustrating a relationship between illuminance and a counted value in each embodiment.

A right diagram of FIG. 7A illustrates the voltage at VC illustrated in FIG. 6A and the signal from VO illustrated in FIG. 6A. In a case where illuminance is low, since a time interval at which photons are incident on the APD 201 is long, sufficient time can be secured until the quench element 202 is recharged and the voltage becomes high after the voltage at VC becomes low after the incidence of a photon. The right diagram of FIG. 7A illustrates a case where three pulses corresponding to three photons can be counted. On the other hand, in a case where illuminance is high, since a time interval at which photons are incident on the APD 201 is short, the voltage at VC is maintained at a low level and does not return to a high level, and it takes time for the voltage to exceed a determination threshold from the low level. The right diagram of FIG. 7A illustrates a case where only the three pulses are counted regardless of the fact that approximately 20 photons are incident on the APD 201. That is, counting of photons fails.

As a result, in a mode in which the passive recharging illustrated in FIG. 6A is performed, the counted value may be the same for low illuminance and high illuminance, as illustrated in FIG. 7A. In a case where photons are more frequently incident on the APD 201, a state in which the voltage at VC is low is maintained and the voltage does not exceed the determination threshold from the low level. In this case, the voltage at VO is maintained at a high level and no signal is generated. That is, in the mode in which the passive recharging illustrated in FIG. 6A is performed, in a case where the illuminance is high, an appropriate counted value cannot be obtained and the dynamic range becomes narrow.

Clock Recharging Circuit

FIG. 6B is a block diagram and an equivalent circuit diagram of a pixel circuit that performs clock recharging driving. A logic circuit 221 (OR circuit) is configured such that a signal Pctrl and a signal STOP are input to the input of the logic circuit 221. The signal Pctrl is a clock signal having a number Nc of pulse signals in the exposure period T.

In FIG. 6B, in a case where the signal STOP is at the L level and the signal Pctrl is at the L level, a transistor 202 is on and recharged. In a case where a signal pattern other than the pattern in which the signal STOP is at the L level and the signal Pctrl is at the L level occurs, the transistor 202 is turned off. That is, the transistor functions as a recharging circuit that switches between a first state in which an APD 201 is connected to a power source and a second state in which the APD 201 is not connected to the power source, and that recharges the APD 201 every time the APD 201 is connected to the power source. The signal Pctrl is a control signal to control the recharging circuit.

For example, in a case where the signal Pctrl is at an H level, the transistor is off after the recharging and thus is a standby state in which avalanche multiplication is possible. In other words, the circuit (transistor) is disposed between the APD 201 and the power source (voltage VH) and controls to switch between the first state in which the APD 201 is connected to the power source and the second state in which the APD 201 is not connected to the power source. In this case, the first state is the recharged state, and the second state is the standby state.

A logic circuit 222 (AND circuit in which logic of one of inputs is inverted) is disposed between the cathode of the APD 201 and a counter 211. The logic circuit 222 is configured such that the signal Pctrl and output from VC can be input to the logic circuit 222. The output from VC is inverted and input to the logic circuit 222, and the voltage at VC transitions from the H level to the L level due to the incidence of a photon. In this case, when the signal Pctrl is at the H level, the output of the logic circuit 222 becomes the H level. Thereafter, in a case where the signal Pctrl transitions from the H level to the L level, the output of the logic circuit 222 becomes the L level and an output signal is generated.

Figure 7B:
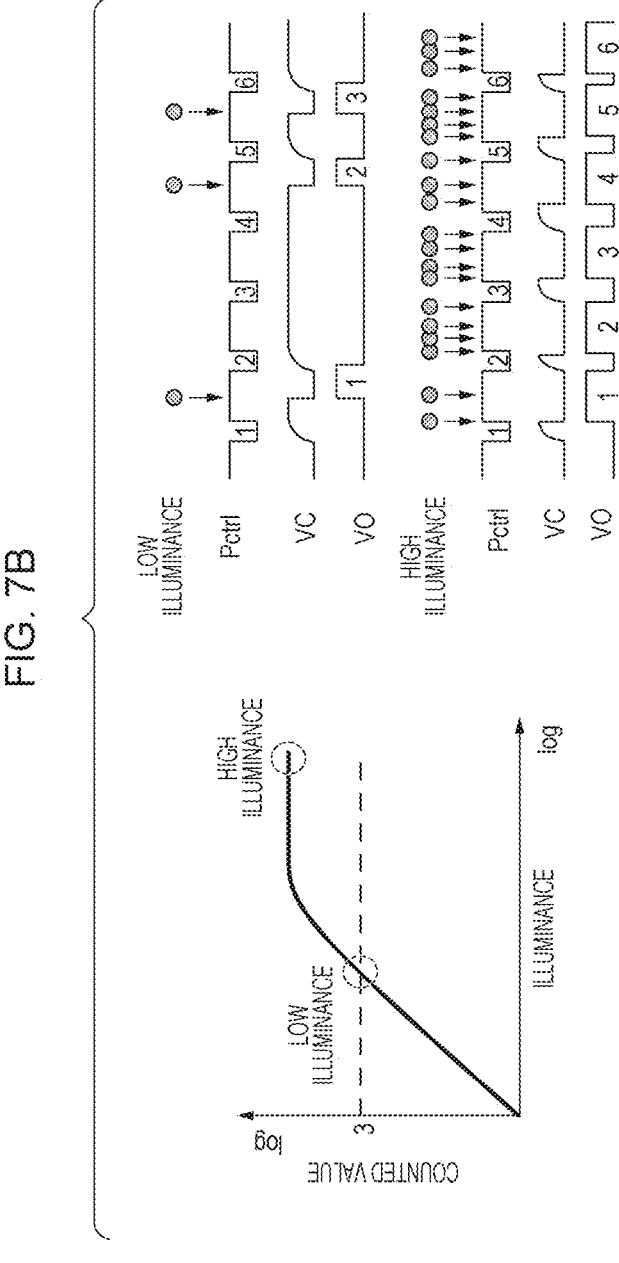

A right diagram of FIG. 7B illustrates the signal Pctrl, the voltage at VC, and the signal from VO illustrated in FIG. 6B.

In a case where the illuminance is low and the signal Pctrl is at the H level (standby state), when a photon is incident on the APD 201, the voltage at VC drops and transitions to the L level. Since the signal Pctrl is at the H level, the output from VO becomes H level. Thereafter, when the signal Pctrl becomes the L level, the output from VO transitions from the H level to the L level and a signal is generated.

On the other hand, in a case where the illuminance is high and the signal Pctrl is at the H level (standby state), even in a case where photons are frequently incident on the APD 201, the voltage at VO that has become the H level is maintained at the H level as long as the signal Pctrl is at the H level. Next, the signal Pctrl transitions from the H level to the L level, and thus the output from VO transitions from the H level to the L level and a single signal is generated.

In a clock recharging circuit, a case where the counted value for low illuminance is the same as the counted value for high illuminance in a case where the passive recharging is performed, or a case where no signal is generated is eliminated. That is, the clock recharging circuit has an advantage that the counted value for low illuminance does not exceed the counted value for high illuminance. The clock recharging circuit is configured such that a signal output from the logic circuit 222 is output from the counter 211 via a memory 240 to the outside. Whether a pulse output from the logic circuit 222 is counted at the time of falling of the pulse or is counted at the time of rising of the pulse immediately preceding the falling can be appropriately set. According to this configuration, an appropriate counted value can be obtained in a case where the illuminance is high and the dynamic range can be increased, as compared with a passive quench circuit.

Clock Recharging Circuit Having Inactive Period

FIGS. 8A and 8B are diagrams illustrating methods for generating a clock signal Pctrl to be used for clock recharging driving. FIG. 8A illustrates a clock signal Pctrl generated by inverting a clock signal PCLK. A clock signal Pctrl illustrated in FIG. 8A is used in a time period for which an inactive period is 0%. FIG. 8B illustrates a clock Pctrl generated by masking every other signal of a clock signal PCLK using a mask circuit to invert the clock signal PCLK. The clock signal Pctrl illustrated in FIG. 8B is used in a time period for which the inactive period is 50%. Although not illustrated, a signal that is used in a time period for which the inactive period is 75% is obtained by masking the second to fourth signals of the clock signal PCLK without masking the first signal of the clock signal PCLK.

FIG. 8C is a timing chart assuming a case where the inactive period is 50%. It is assumed that, among signals 801 to 804, the signals 802 and 804 are masked, and the inactive period is set to 50%. However, a time period from falling of a signal 811 generated from the signal 801 to falling of a signal 813 generated from the signal 803 is a standby period after recharging. Therefore, in FIG. 8C, avalanche multiplication occurs due to a photon that has been incident on the APD 201 in a mask period, the voltage at VC decreases, the voltage at VO increases, the counter counts 1. That is, in a case where no measures are taken, light that has been incident on the APD 201 within the time period in which the masking has been performed is counted, and the inactive period cannot be appropriately set.

Figure 9:
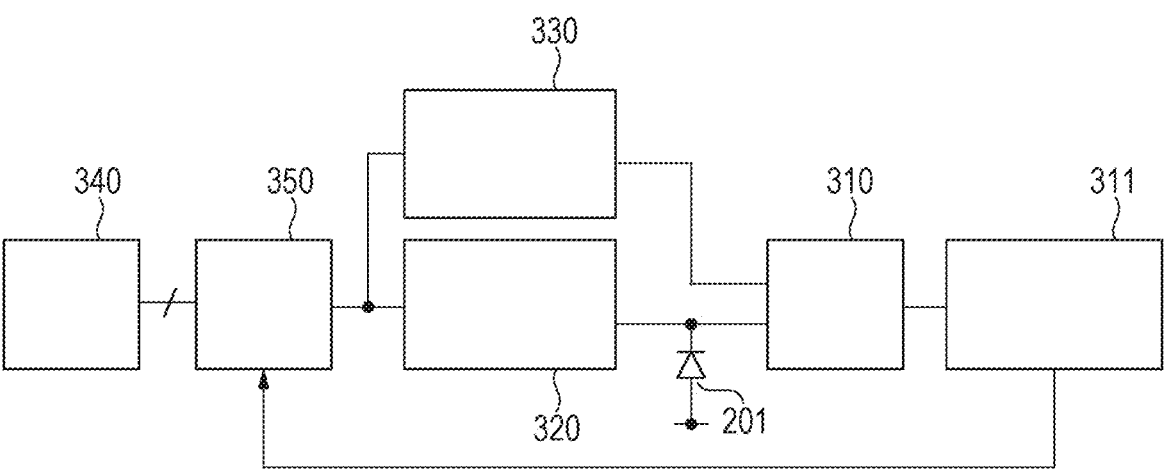
FIG. 9 is a block diagram illustrating a configuration of a photoelectric conversion apparatus according to a first embodiment.

FIG. 9 is a block diagram of a photoelectric conversion apparatus provided to solve the above-described issues.

The photoelectric conversion apparatus includes an APD 201 and a count pulse generating circuit 310 that generates a pulse signal from a signal output from the APD 201. The pulse signal output from the count pulse generating circuit 310 is counted by a counter 311.

A mask signal generating circuit 340 generates a plurality of types of patterns of signals for masking a clock signal PCLK. A mask signal selecting circuit 350 selects which of these signals is to be output to the following stage.

A count control circuit 330 generates a signal to control whether a signal to be counted by the counter 311 is output from the count pulse generating circuit 310.

Figure 10:
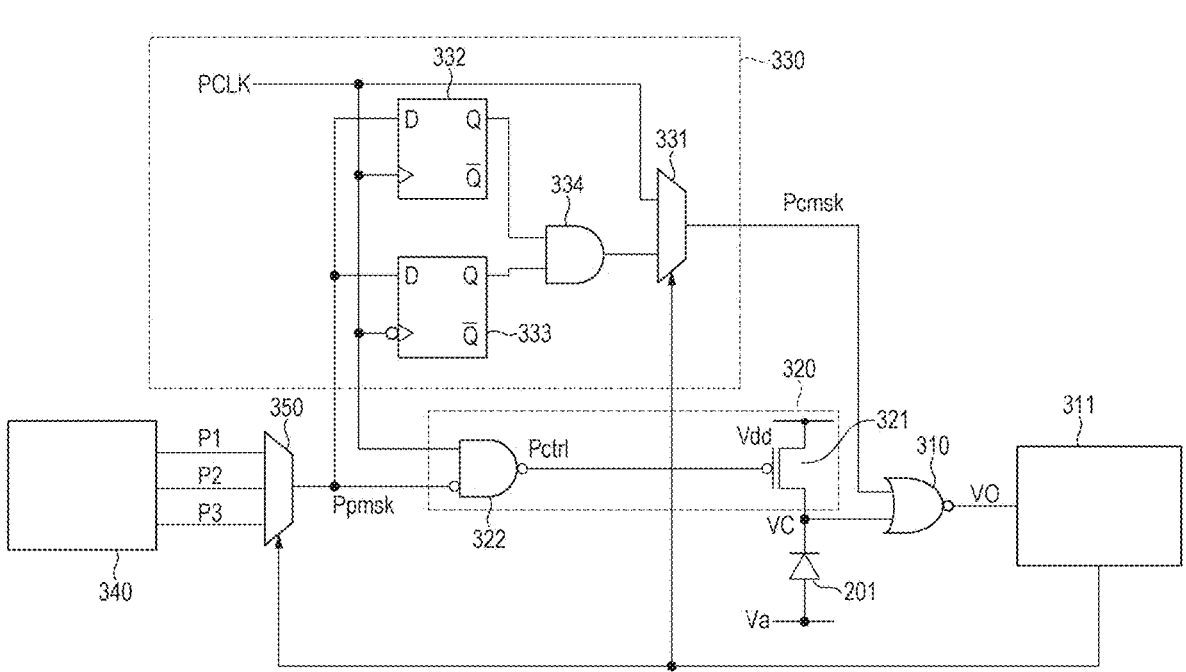
FIG. 10 is a diagram illustrating the configuration of the photoelectric conversion apparatus according to the first embodiment in detail.
Figure 11:
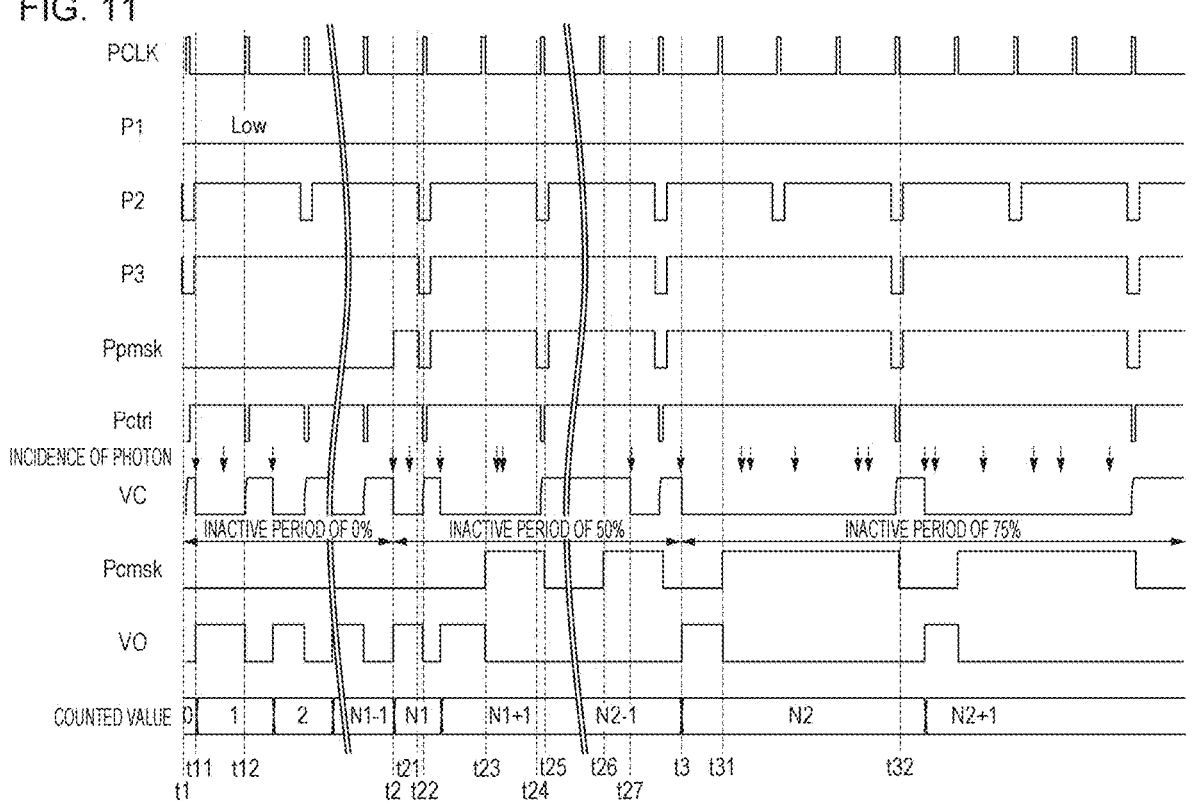
FIG. 11 is a timing chart regarding driving of the photoelectric conversion apparatus according to the first embodiment.

FIG. 10 is a diagram for explaining the block diagram of FIG. 9 in detail. FIG. 11 is a timing chart corresponding to the block diagram of FIG. 10.

The mask signal generating circuit 340 illustrated in FIG. 10 generates P1, P2, and P3. P1 is a mask signal corresponding to an inactive period of 0%. P2 is a mask signal corresponding to the inactive period of 50%. P3 is a mask signal corresponding to the inactive period of 75%. The mask signal generating circuit 340 is provided in a signal processing unit 103 and generates the mask signals using a signal input from the outside of the signal processing unit 103. Specifically, the mask signal generating circuit 340 may generate the mask signals using a frequency dividing circuit.

The mask signal selecting circuit 350 selects which signal is to be output among P1 to P3. The signal output from the mask signal circuit 350 is represented as Ppmsk. P1 to P3 may be referred to as mask signals for convenience. Ppmsk that is a signal based on P1 to P3 may be referred to as a mask signal. In addition, as described later, P1 is the mask signal maintained at the L level and does not have a function of masking a signal of PCLK. Therefore, P2, P3, and Ppmsk corresponding to P2 and P3 may be referred to as mask signals.

At the start time of an exposure period, the signal P1 is output from the mask signal selecting circuit 350. Next, in a case where a counted value of the counter 311 reaches a threshold N1, the mask signal selecting circuit 350 selects and outputs the signal P2. Then, in a case where the counted value of the counter 311 reaches a threshold N2, the mask signal selecting circuit 350 selects and outputs the signal P3.

A photodiode control circuit 320 includes a PMOS transistor that performs recharging and a control signal generating circuit 322 that outputs Pctrl to be input to the gate of the PMOS transistor. The control signal generating circuit 322 includes a NAND circuit in which logic of one of inputs is inverted. The control signal generating circuit 322 is configured such that PCLK and Ppmsk are input to the control signal generating circuit 322.

That is, the control generating circuit 322 is a control circuit that generates a control signal having different periods based on the clock signal and the mask signal. Inactive period of 0%

Referring to FIG. 11, in a time period for which the inactive period is 0%, the mask signal P1 at the L level is input as Ppmsk to the control signal generating circuit 322. At a time t1, PCLK is at the L level and thus Pctrl output from the control signal generating circuit 322 is at the L level. Therefore, the PMOS transistor 321 that is a recharging circuit is in an on state and a reverse bias voltage is applied to the APD 201 such that avalanche multiplication is possible in the APD 201. Next, when PCLK transitions from the H level to the L level, Pctrl transitions to the H level, and the PMOS transistor 321 is turned off and goes into a standby state.

When a photon is incident on the APD 201 in the standby state at a time t11, the voltage at VC drops from the H level to the L level, and a signal at the L level is input to the count pulse generating circuit 310. Therefore, output VO from the count pulse generating circuit 310 transitions from the H level to the L level. The counter 311 starts counting at the time of rising of the output VO. Although a photon is incident on the APD 201 again after the time t11, the PMOS transistor 321 remains off, VC is already at the L level, and thus avalanche multiplication does not occur and VC is maintained at the L level.

When PCLK transitions from the L level to the H level at a time t12, Pctrl transitions from the H level to the L level, the PMOS transistor 321 is turned on, the APD 201 is recharged, and VC transitions from the L level to the H level. Since VC transitions from the L level to the H level, the output from the count pulse generating circuit 310 transitions from the H level to the L level.

A selecting circuit 331 is configured to output, as Pcmsk, the output from a logic circuit 334 in a case where the inactive period is 0%. Pcmsk is a signal to be input to the count pulse generating circuit 310 and controls a signal to be output from the count pulse generating circuit 310 to the counter 311. Therefore, it can be said that Pcmsk is referred to as a count control signal and that the count control circuit 330 generates the count control signal.

In a case where the inactive period is 0%, Ppmsk is maintained at the L level and thus at the time of both rising and falling of PCLK, output of a D latch 332 and output of a D latch 333 become the L level, and output from the logic circuit 334 becomes the L level. As a result, Pcmsk is maintained at the L level, and a signal obtained by inverting an output signal from VC is output from the count pulse generating circuit 310. As described later about description of a time t27, in a case where Ppmsk is at the H level, even when VC transitions from the H level to the L level, the output VO from the count pulse generating circuit 310 is maintained at the L level and thus the counter 311 does not perform counting.

Inactive Period of 50%

In a case where the counted value of the counter 311 reaches the threshold N1, the mask signal selecting circuit 350 selects and outputs the signal P2. Specifically, at the time t2, Ppmsk is changed from the signal corresponding to P1 to the signal corresponding to P2. P2 is different from P1 and is a signal of a combination of the L level and the H level. A time period for which the P2 is at the H level is a mask period. Even in a case where PCLK is at the H level during the mask period, Pctrl is set such that the PMOS transistor 321 is not turned on. The inactive period of 50% is a time period for which the mask signal P2 is set to mask 50% of the clock signal forming PCLK. In FIG. 11, P2 is set to the H level to mask every other signal included in the clock signal forming PCLK.

When P2 transitions from the H level to the L level at a time t21, Ppmsk transitions from the H level to the L level. When PCLK transitions from the L level to the H level at a time t22, Pctrl that is output from the control signal generating circuit 322 transitions from the H level to the L level. Therefore, the APD 201 is recharged.

Although PCLK transitions from the L level to the H level at a time t23, P2 and Ppmsk are at the H level and thus Pctrl is maintained at the H level, the APD 201 is not recharged, and VC is maintained at the L level. That is, P2 and Ppmsk function as mask signals, and the period of Pctrl increases. Specifically, in a case where the period of Pctrl in the inactive period of 0% is a first period, the period of Pctrl in the inactive period of 50% is a second period longer than the first period.

Meanwhile, the H level is input to the D latches 332 and 333, and thus a signal at the H level is output to the logic circuit 334 at the time of rising and falling of PCLK, and the output signal Pcmsk from the selecting circuit 331 transitions from the L level to the H level. Since VC is at the L level at the time t23, VO transitions from the H level to the L level.

At a time t24, Ppmsk transitions from the H level to the L level and the L level is input to the D latches 332 and 333. Thereafter, a signal at the L level is output from the D latch 332 to the logic circuit 334 at the time of rising of PCLK, and a signal at the L level is output from the D latch 333 to the logic circuit 334 at the time of falling of PCLK. Therefore, Pcmsk transitions from the H level to the L level at a time t25.

At a time t26, Pcmsk transitions from the L level to the H level, similarly to the transition at the time t23.

When a photon is incident on the APD 201 at the time t27, VC transitions to the L level, but Pcmsk is at the H level and thus VO is maintained at the H level and the counter 311 does not perform counting. Even when a photon is incident on the APD 201 in the mask period, the count control circuit 330 performs control such that a signal is not output from the count pulse generating circuit. Specifically, the count control circuit 330 generates the signal Pcmsk based on the mask signals (P1, P2, and P3) to generate Pctrl to be input to the PMOS transistor 321 of the photodiode control circuit 320. In addition, the count control circuit 330 controls an output signal from the count pulse generating circuit 310 based on the signal Pcmsk. Therefore, it is possible to suppress counting light that has been incident on the APD 201 within a time period in which the signal Pctrl has been masked and it is possible to appropriately set the inactive period.

Inactive Period of 75%

When the counted value of the counter 311 reaches the threshold N2, the mask signal selecting circuit 350 selects and outputs the signal P3. Specifically, at a time t3, Ppmsk is changed from the signal corresponding to P2 to the signal corresponding to P3. The period of the mask signal P3 is longer than the period of the mask signal P2. That is, a time interval at which pulses of the mask signal P3 are generated is longer than a time interval at which pulses of the mask signal P2 are generated. As a result, the period of Pctrl in the inactive period of 75% is longer than the period of Pctrl in the inactive period of 50%. Specifically, in a case where the period of Pctrl in the inactive period of 50% is the second period, the period of Pctrl in the inactive period of 75% is a third period longer than the second period.

A time period for which P3 is at the H level is a mask period, similarly to P2. Even in a case where PCLK is at the H level during the mask period, Pctrl is set such that the PMOS transistor 321 is not turned on. The inactive period of 75% is a time period for which the mask signal P3 is set to mask 75% of the clock signal forming PCLK. In FIG. 11, the signal Pctrl is generated by masking three consecutive signals included in the clock signal forming PCLK, and using a single signal that is included in the clock signal forming PCLK and follows the three pulse signals.

At a time t31, Pcmsk transitions from the L level to the H level, similarly to the transition at the time t23 and the time t26, and the mask period is started. At a time t32, Pcmsk transitions from the H level to the L level, similarly to the transition at the time t25, and the mask periods ends.

Correction

Figure 12:
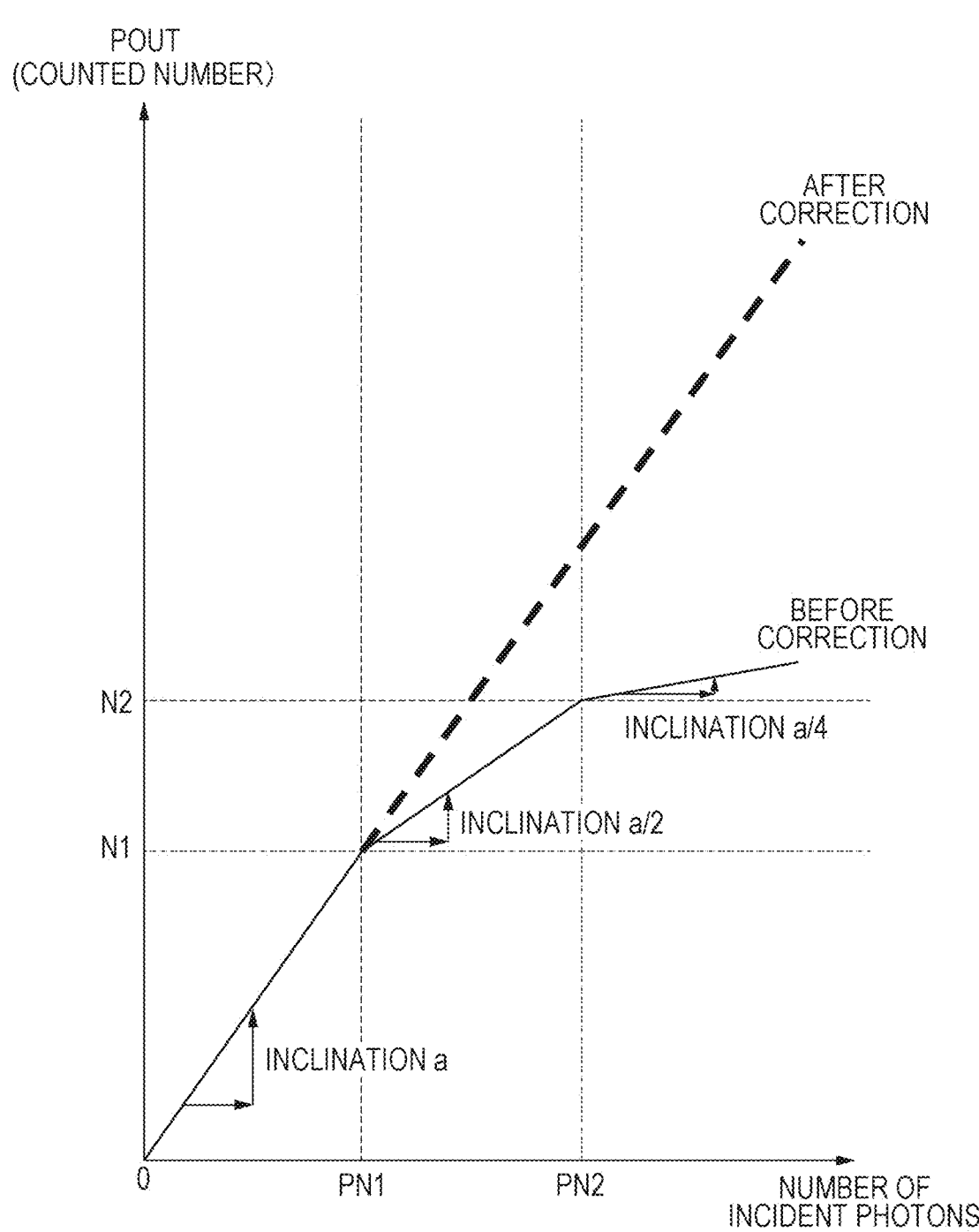
FIG. 12 is a diagram illustrating the concept of correction by the photoelectric conversion apparatus according to the first embodiment.

FIG. 12 is a diagram illustrating a relationship between the number of photons that have been incident on the APD and a number POUT of photons counted by the counter 311. The inclination of the number POUT with respect to the number of photons that have been incident on the APD is an inclination a until the counted number POUT reaches the threshold N1. Ideally, in a case where the counter 311 counts all photons that have been incident on the APD without failing to count a photon, the inclination a is 1, and the number PN1 of photons matches the threshold N1.

When the counted number POUT reaches the threshold N1, the inactive period shifts to the inactive period of 50%. Therefore, the inclination of the counted number POUT with respect to the number of photons that have been incident on the APD becomes a/2. When the counted number POUT reaches the threshold N2, the inactive period shifts to the inactive period of 75%. Therefore, the inclination of the counted number POUT with respect to the number of photons that have been incident on the APD becomes a/4.

In a case where the counted value Nx exceeds the threshold N1, the counted number POUT is corrected for counted values in a range in which the inclination of the counted number POUT with respect to the number of photons that have been incident on the APD is different from the inclination a such that the inclination of the counted number POUT with respect to the number of photons that have been incident on the APD matches the inclination a. A correction unit that performs the correction may be a signal processing circuit provided in the photoelectric conversion apparatus or may be a signal processing circuit provided outside the photoelectric conversion apparatus.

Effects

With the configuration according to the present embodiment, it is possible to increase the dynamic range and reduce the number of times that avalanche multiplication is performed in a case where light with high illuminance is incident on the APD, and thus it is possible to reduce power consumption.

With the configuration according to the present embodiment, it is possible to suppress counting of light that has been incident on the APD within a time period in which the signal Pctrl has been masked, and it is possible to appropriately set the inactive period.

Second Embodiment

The present embodiment is different from the above-described first embodiment in that the selecting circuit 331 outputs PCLK as Pcmsk instead of output from the logic circuit 334 in a time period for which the inactive period is 0%. Other configurations in the present embodiment are the same as or similar to those described in the first embodiment.

Figure 13:
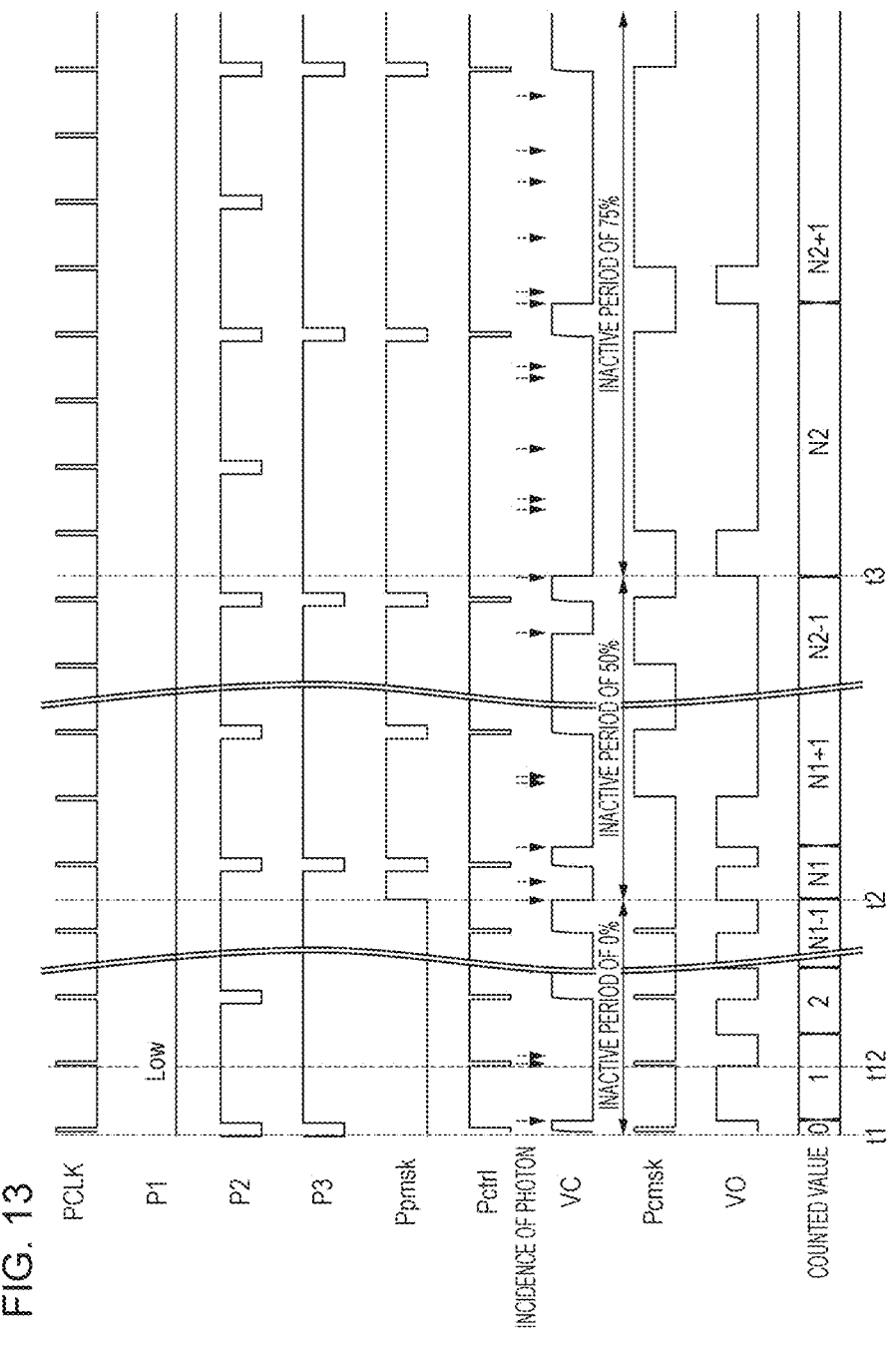
FIG. 13 is a timing chart regarding driving of a photoelectric conversion apparatus according to a second embodiment.

In FIG. 11 described in the first embodiment, Pcmsk is maintained at the L level in the inactive period of 0% from the time t1 to the time t2. However, in FIG. 13, in the inactive period of 0% from the time t1 to the time t2, PCLK is Pcmsk. At a time t12, Pctrl becomes the L level, the PMOS transistor 321 is turned on and becomes recharged. However, as illustrated in FIG. 13, when a photon is incident on the APD at the time of the recharging, VC may not become the H level. Particularly, in a case where the illuminance is high, such a phenomenon occurs. In a case where VC does not become the H level, VO does not become the L level and counting of a photon may fail. On the other hand, according to the present embodiment, the count pulse generating circuit 310 is configured such that the signal Pcmsk is input to the count pulse generating circuit 310. Therefore, when Pcmsk transitions from the L level to the H level, VO transitions from the H level to the L level even in a case where VC is at the L level. Therefore, the present embodiment has an advantage that it is possible to reduce a failure of counting.

With the configuration according to the present embodiment, it is possible to increase the dynamic range and reduce the number of times that avalanche multiplication is performed in a case where light with high illuminance is incident on the APD, and thus it is possible to reduce power consumption.

In addition, with the configuration according to the present embodiment, it is possible to suppress counting of light that has been incident on the APD within a time period in which the signal Pctrl has been masked, and it is possible to appropriately set the inactive period.

Further, with the configuration according to the present embodiment, it is possible to reduce a failure of counting in a case where illuminance is high.

Third Embodiment

The present embodiment is different from the first and second embodiments in that the mask signal generating circuit 340 is not provided in each of the signal processing units 103 included in the respective pixels and is provided in common for a plurality of pixel circuits 410. Other configurations in the present embodiment are the same as or similar to those described in the above-described embodiments.

Figure 14:
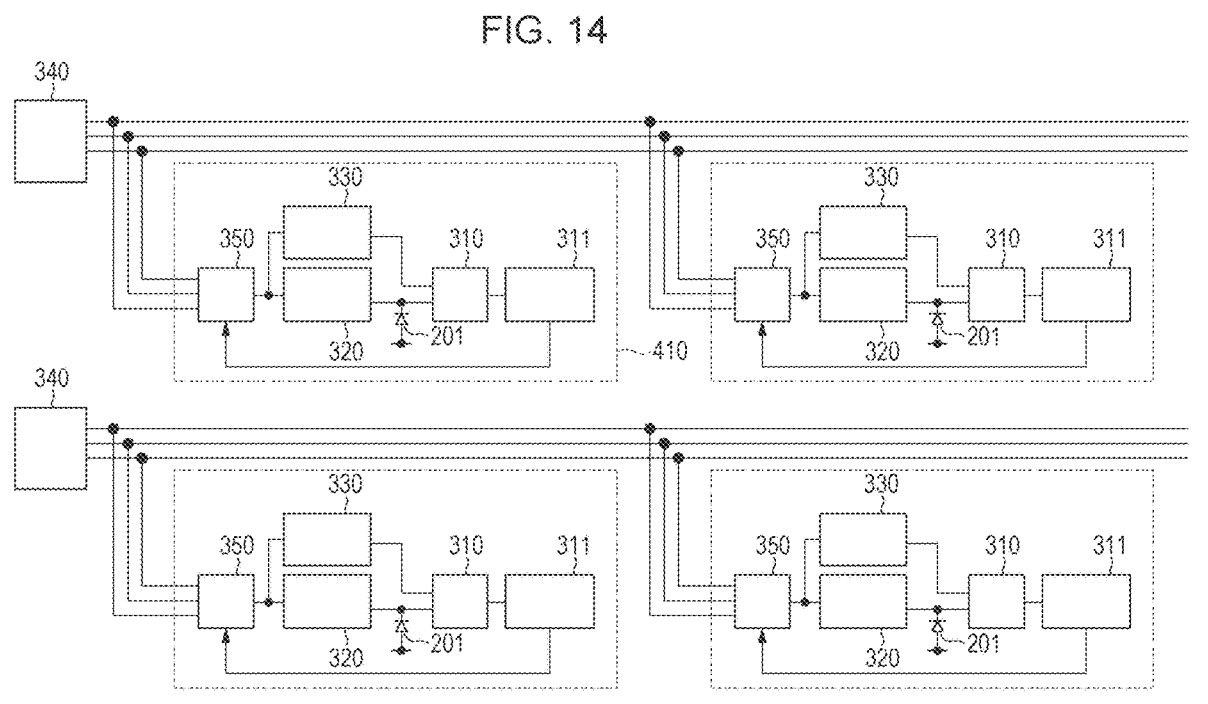

FIG. 14 illustrates an example in which the mask signal generating circuit 340 is provided in common for the pixel circuits 410 disposed in each of rows. In a case where the mask signal generating circuit 340 is disposed for each of the pixel circuits 410, the circuit size increases and spaces in which the other circuits such as the counters are disposed decrease in size. According to the present embodiment, it is possible to suppress an increase in the circuit size.

With the configuration according to the present embodiment, it is possible to increase the dynamic range and reduce the number of times that avalanche multiplication is performed in a case where light with high illuminance is incident on the APD, and thus it is possible to reduce power consumption.

In addition, with the configuration according to the present embodiment, it is possible to suppress counting of light that has been incident on the APD within a time period in which the signal Pctrl has been masked, and it is possible to appropriately set the inactive period.

Further, with the configuration according to the present embodiment, it is possible to suppress an increase in the circuit size.

Modifications

In the embodiments described herein, the inactive period may not gradually increase to the exposure period. For example, in a first mode, driving for which only the mask signal P1 is used and the inactive period is not provided may be adopted. In a second mode, driving for which the mask signals P1 to P3 are used and the inactive period is provided may be adopted. Specifically, in a first exposure period, the driving in the first mode can be performed. In a second exposure period following the first exposure period, the driving in the second mode can be performed.

In the above-described embodiments, the three types of mask signals are used, but any types of mask signals may be used as long as the number of types of mask signals is two or more.

Fourth Embodiment

Figure 15:
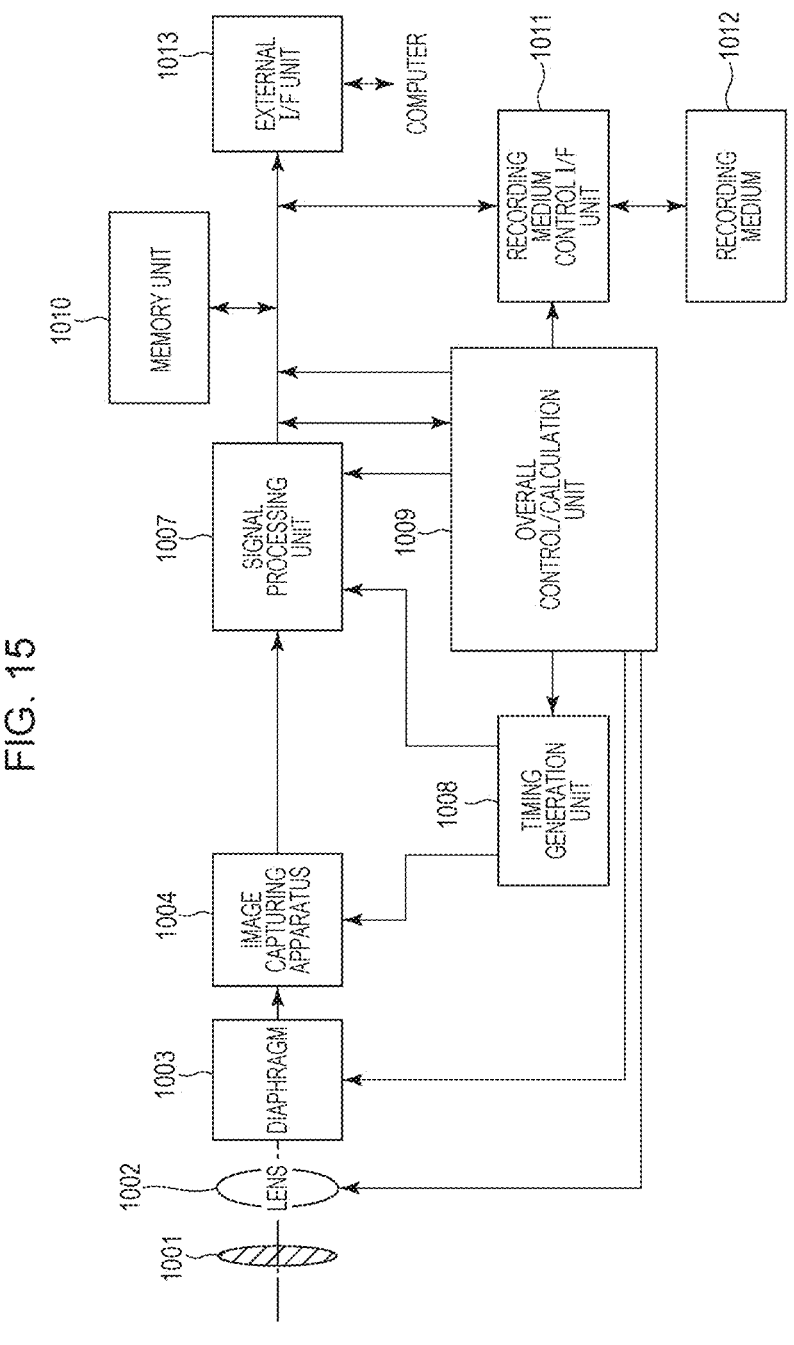
FIG. 15 is a block diagram illustrating a configuration of a photoelectric conversion system according to a fourth embodiment.

A photoelectric conversion system according to the present embodiment will be described with reference to FIG. 15. FIG. 15 is a block diagram illustrating a schematic configuration of the photoelectric conversion system according to the present embodiment.

The photoelectric conversion apparatus described above in each of the embodiments can be used in various photoelectric conversion systems. Examples of the photoelectric conversion systems in which the photoelectric conversion apparatus described above in each of the embodiments can be used include a digital still camera, a digital camcorder, a monitoring camera, a copier, a facsimile machine, a mobile phone, an on-vehicle camera, and an observation satellite.

In addition, the examples of the photoelectric conversion systems include a camera module having an optical system such as a lens and an image capturing apparatus. FIG. 15 illustrates a block diagram of a digital still camera as one of the examples of the photoelectric conversion systems.

The photoelectric conversion system illustrated in FIG. 15 includes an image capturing apparatus 1004 as an example of the photoelectric conversion apparatus, and a lens 1002 that forms an optical image of an object on the image capturing apparatus 1004. The photoelectric conversion system further includes a diaphragm 1003 that makes variable the amount of light that has passed through the lens 1002, and a barrier 1001 that protects the lens 1002. The lens 1002 and the diaphragm 1003 are an optical system that focuses light on the image capturing apparatus 1004. The image capturing apparatus 1004 is the photoelectric conversion apparatus according to any one of the above-described embodiments and converts the optical image formed by the lens 1002 into an electric signal.

The photoelectric conversion system further includes a processing unit 1007 that is an image generation unit that generates an image by processing a signal output by the image capturing apparatus 1004. The processing unit 1007 performs various types of correction and compression as necessary and performs an operation of outputting image data. The processing unit 1007 may be formed in a semiconductor layer in which the image capturing apparatus 1004 is disposed, or may be formed in a semiconductor layer different from the semiconductor layer in which the image capturing apparatus 1004 is disposed. The image capturing apparatus 1004 and the processing unit 1007 may be formed in the same semiconductor layer.

The photoelectric conversion system further includes a memory unit 1010 for temporarily storing image data, and an external interface unit (external I/F unit) 1013 for communicating with an external computer or the like. The photoelectric conversion system further includes a recording medium 1012 such as a semiconductor memory for recording or reading image data, and a recording medium control interface unit (recording medium control I/F unit) 1011 for recording or reading data in and from the recording medium 1012. The recording medium 1012 may be built in the photoelectric conversion system or detachably disposed in the photoelectric conversion system.

The photoelectric conversion system further includes an overall control/calculation unit 1009 that controls various types of calculation and the overall digital still camera, and a timing generation unit 1008 that outputs various types of timing signals to the image capturing apparatus 1004 and the processing unit 1007. The timing signals and the like may be input from an external to the photoelectric conversion system. It suffices for the photoelectric conversion system to include at least the image capturing apparatus 1004 and the processing unit 1007 that processes a signal output from the image capturing apparatus 1004.

The image capturing apparatus 1004 outputs an imaged signal to the processing unit 1007. The processing unit 1007 performs predetermined signal processing on the imaged signal output from the image capturing apparatus 1004 and outputs image data. The processing unit 1007 generates an image using the imaged signal.

According to the present embodiment, it is possible to implement the photoelectric conversion system including the photoelectric conversion apparatus (image capturing apparatus) according to any one of the above-described embodiments.

Fifth Embodiment

Figures 16A, 16B:
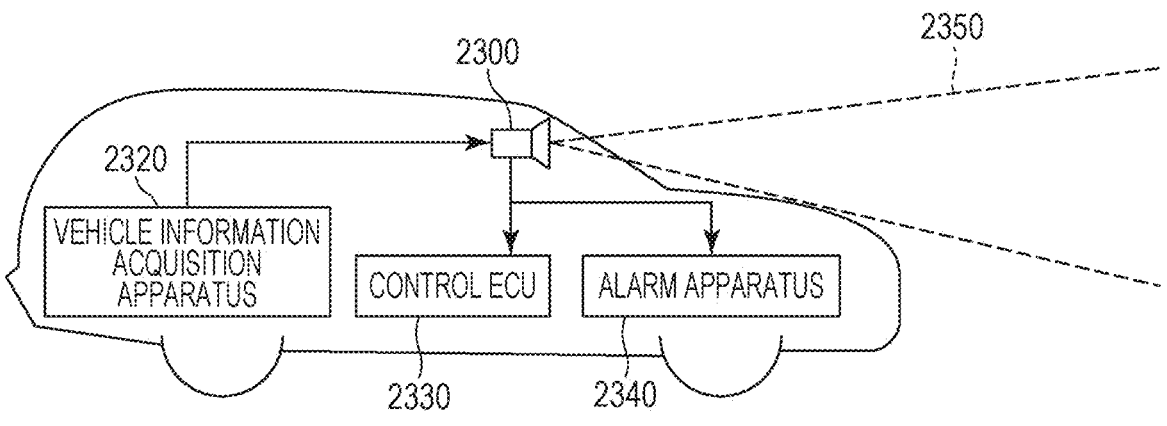
FIGS. 16A and 16B are block diagrams illustrating a configuration of a photoelectric conversion system according to a fifth embodiment.

A photoelectric conversion system and a moving object according to the present embodiment will be described with reference to FIGS. 16A and 16B. FIGS. 16A and 16B are diagrams illustrating configurations of the photoelectric conversion system and the moving object according to the present embodiment.

FIG. 16A illustrates an example of the photoelectric conversion system for an on-vehicle camera. The photoelectric conversion system 2300 includes an image capturing apparatus 2310. The image capturing apparatus 2310 is the photoelectric conversion apparatus according to any one of the above-described embodiments. The photoelectric conversion system 2300 includes an image processing unit 2312 that performs image processing on a plurality of image data pieces acquired by the image capturing apparatus 2310. The photoelectric conversion system 2300 includes a parallax acquisition unit 2314 that calculates parallax (difference in phase between parallax images) from the image data pieces acquired by the image capturing apparatus 2310. The photoelectric conversion system 2300 further includes a distance acquisition unit 2316 that calculates a distance to a target object based on the calculated parallax, and a collision determination unit 2318 that determines whether there is a possibility that collision occurs. The parallax acquisition unit 2314 and the distance acquisition unit 2316 are an example of a distance information obtaining unit that obtains distance information regarding the distance to the target object. That is, the distance information is information regarding the parallax, a de-focusing amount, the distance to the target object, and the like. The collision determination unit 2318 may use any one of these information items to determine whether there is a possibility that collision occurs. The distance information obtaining unit may be implemented by exclusively designed hardware or may be implemented by a software module. Alternatively, the distance information obtaining unit may be implemented by a field programmable gate array (FPGA), an application specific integrated circuit (ASIC), or the like or may be implemented by a combination of an FPGA and an ASIC.

The photoelectric conversion system 2300 is connected to a vehicle information acquisition apparatus 2320 and can acquire vehicle information regarding a vehicle speed, a yaw rate, a steering angle, and the like of the vehicle. The photoelectric conversion system 2300 is connected to a control ECU 2330 that is a control device (control unit) that outputs, based on a result of the determination by the collision determination unit 2318, a control signal to generate a braking force for the vehicle. The photoelectric conversion system 2300 is connected to an alarm apparatus 2340 that issues an alarm to a driver based on the result of the determination by the collision determination unit 2318. For example, in a case where there is a high possibility that collision occurs as a result of the determination by the collision determination unit 2318, the control ECU 2330 controls the vehicle to avoid the collision or reduce damage by applying a brake, returning an accelerator, suppressing engine output, or the like.

The alarm apparatus 2340 warns the user by sounding an alarm such as making a sound, displaying alarm information on a screen of a car navigation system or the like, giving vibration to a seatbelt or a steering, or the like.

In the present embodiment, the photoelectric conversion system 2300 captures an image of surroundings of the vehicle, for example, the front side or the rear side of the vehicle. FIG. 16B illustrates the photoelectric conversion system 2300 that captures an image of the front side (image sensing area 2350) of the vehicle. The vehicle information acquisition apparatus 2320 transmits an instruction to the photoelectric conversion system 2300 or the image capturing apparatus 2310. With this configuration, it is possible to improve the accuracy of the focusing.

The example in which the control is performed to avoid collision with another vehicle is described above. The photoelectric conversion system can be used for control to automatically drive the vehicle by following another vehicle, control to automatically drive the vehicle to avoid straying from a lane, and the like. The photoelectric conversion system is not limited to a system for a vehicle such as an own vehicle and can be used for a moving object (moving apparatus) such as a ship, an airplane, or an industrial robot. The photoelectric conversion system is not limited to a system for a moving object and can be used for apparatuses that widely use object recognition and are an intelligent transportation system (ITS) and the like.

Sixth Embodiment

A photoelectric conversion system according to the present embodiment will be described with reference to FIG. 17.

Figure 17:
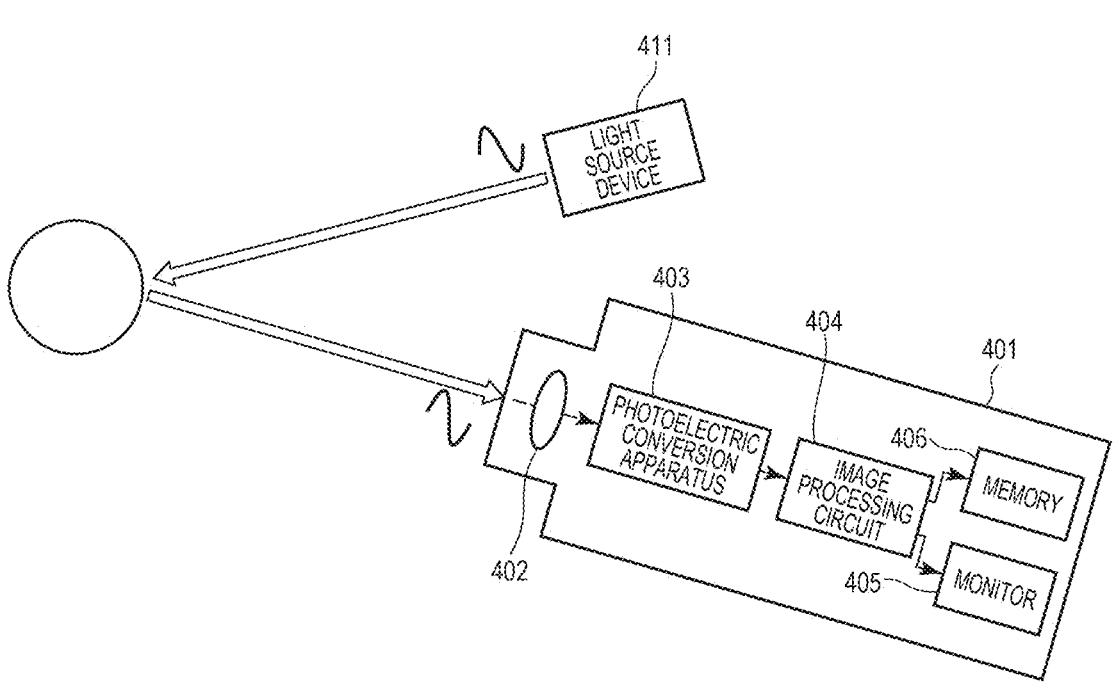
FIG. 17 is a block diagram illustrating a configuration of a photoelectric conversion system according to a sixth embodiment.

FIG. 17 is a block diagram illustrating an example of a configuration of a distance image sensor that is the photoelectric conversion system according to the present embodiment.

As illustrated in FIG. 17, the distance image sensor 401 includes an optical system 402, a photoelectric conversion apparatus 403, an image processing circuit 404, a monitor 405, and a memory 406. The distance image sensor 401 acquires a distance image corresponding to a distance to an object by receiving light (modulated light and pulsed light) emitted from a light source device 411 to the object and reflected off a surface of the object.

The optical system 402 includes one or a plurality of lenses. The optical system 402 guides image light (incident light) from the object to the photoelectric conversion apparatus 403 and forms an image on a light receiving surface (sensor portion) of the photoelectric conversion apparatus 403.

As the photoelectric conversion apparatus 403, the photoelectric conversion apparatus described in any one of the embodiments is used. A distance signal indicating a distance calculated from a received optical signal output from the photoelectric conversion apparatus 403 is supplied to the image processing circuit 404.

The image processing circuit 404 performs image processing to generate a distance image based on the distance signal supplied from the photoelectric conversion apparatus 403. The distance image (image data) obtained by the image processing is supplied to and displayed on the monitor 405 and supplied to and stored (recorded) in the memory 406.

Since the above-described photoelectric conversion apparatus is used in the distance image sensor 401 configured as described above, the distance image sensor 401 can acquire a more accurate distance image as the characteristics of pixels are improved.

Seventh Embodiment

Figure 18:
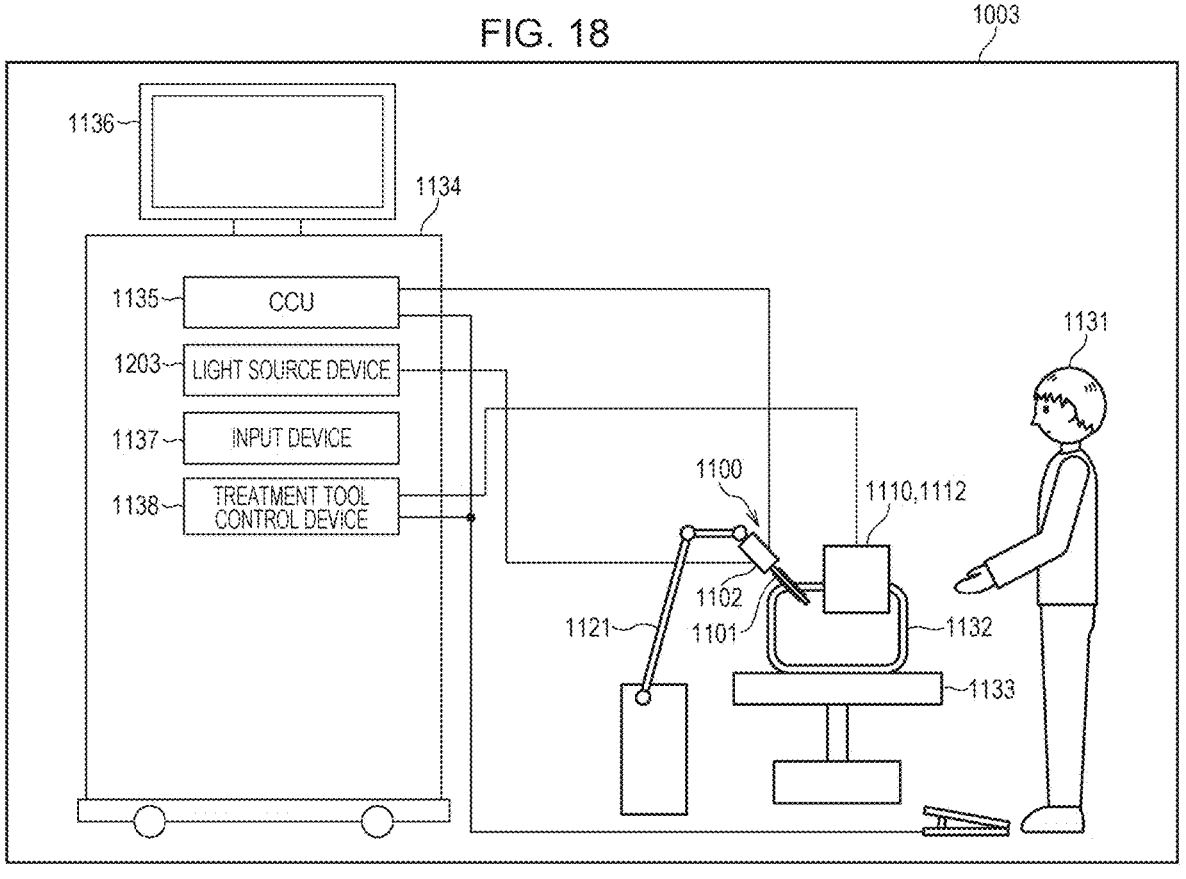
FIG. 18 is a block diagram illustrating a configuration of a photoelectric conversion system according to a seventh embodiment.

A photoelectric conversion system according to the present embodiment will be described with reference to FIG. 18. FIG. 18 is a diagram illustrating an example of a schematic configuration of an endoscope surgery system that is the photoelectric conversion system according to the present embodiment.

FIG. 18 illustrates a state in which an operator (doctor) 1131 uses the endoscope surgery system 1103 to perform a surgical operation on a patient 1132 on a patient bed 1133. As illustrated in FIG. 18, the endoscope surgery system 1103 includes an endoscopic 1100, a surgical tool 1110, and a cart 1134 in which various devices are installed for endoscopic surgery.

The endoscope 1100 includes a lens barrel 1101 and a camera head 1102 connected to a base edge of the lens barrel 1101. The lens barrel 1101 includes a portion that has a predetermined length from a leading edge of the lens barrel 1101 and is inserted into a body cavity of the patient 1132. In the example illustrated in FIG. 18, the endoscope 1101 having the rigid lens barrel 1101 and configured as a so-called rigid scope is illustrated. However, the endoscope 1100 may have a flexible lens barrel and may be configured as a flexible scope.

The leading edge of the lens barrel 1101 has an opening portion in which an objective lens is fitted. A light source device 1203 is connected to the endoscope 1100. Light generated by the light source device 1203 is guided to the leading edge of the lens barrel 1101 by a light guide disposed to extend in the lens barrel 1101 and passes through the objective lens, and an observation target in the body cavity of the patient 1132 is irradiated with the light. The endoscope 1100 may be a forward-viewing endoscope, an oblique-viewing endoscope, or a side-viewing endoscope.

An optical system and a photoelectric conversion apparatus are disposed in the camera head 1102. Light (observation light) reflected from the observation target is focused onto the photoelectric conversion apparatus by the optical system. The photoelectric conversion apparatus photoelectrically converts the observation light to generate an electric signal corresponding to the observation light, that is, an image signal corresponding to an observation image. As the photoelectric conversion apparatus, the photoelectric conversion apparatus described above in any one of the embodiments can be used. The image signal is transmitted as raw data to a camera control unit (CCU) 1135.

The CCU 1135 includes a central processing unit (CPU), a graphics processing unit (GPU), or the like and comprehensively controls operations of the endoscope 1100 and a display 1136. The CCU 1135 receives the image signal from the camera head 1102 and performs various types of image processing such as development processing (de-mosaic processing) on the image signal to display an image based on the image signal.

The display 1136 is controlled by the CCU 1135 to display the image based on the image signal subjected to the image processing by the CCU 1135.

The light source device 1203 includes a light source such as a light emitting diode (LED) and supplies, to the endoscope 1100, irradiation light for capturing an image of a part to be subjected to a surgical operation or the like.

An input device 1137 is an input interface for the endoscope surgery system 1103. A user can enter various types of information and instructions to the endoscope surgery system 1103 via the input device 1137.

A treatment tool control device 1138 controls driving of energy treatment tools 1112 for cauterization and incision of tissues, blood vessel sealing, and the like.

The light source device 1203 that supplies irradiation light for capturing an image of a part to be subjected to a surgical operation to the endoscope 1100 can include, for example, an LED, a laser light source, or a white light source formed by combining an LED and a laser light source. In a case where the light source device 1203 includes a white light source formed by combining RGB laser light sources, it is possible to accurately control the intensity of output light of each color (each wavelength) and the timing of outputting the light, and thus, it is possible to adjust white balance of a captured image in the light source device 1203. In this case, it is possible to form images corresponding to RGB in a time-division manner by irradiating the observation target with laser light from the RGB laser light sources in a time-division manner, and controlling driving of an image sensor element of the camera head 1102 in synchronization with the timing of the irradiation. According to this method, a color image can be obtained without providing a color filter in the image sensor element.

The driving of the light source device 1203 may be controlled such that the intensity of light to be output is changed at predetermined time intervals. The driving of the image sensor element of the camera head 1102 can be controlled in synchronization with the timing of changing the intensity of the light such that the image sensor element acquires images in a time-division manner, and the camera head 1102 can generate an image with a high dynamic range and without a black underexposure picture image and an overexposed white portion by synthesizing the acquired images.

The light source device 1203 may be configured to be able to supply light in a predetermined wavelength range for observation with special light. In the observation with special light, for example, dependence of light absorption on wavelengths in body tissues is used. Specifically, a high-contrast image of a predetermined tissue such as a blood vessel on a mucosal surface layer is captured by irradiating the predetermined tissue with light in a narrower range than irradiation light (that is, white light) used in normal observation.

Alternatively, in the observation with special light, fluorescent observation may be performed to acquire an image using fluorescence generated by irradiation with excitation light. In the fluorescent observation, a body tissue is irradiated with excitation light, fluorescence from the body tissue is observed, or a fluorescent image is obtained by locally injecting a reagent such as indocyanine green (ICG) into the body tissue and irradiating the body tissue with excitation light corresponding to a fluorescent wavelength of the reagent. The light source device 1203 may be configured to be able to supply light in a narrow band and/or excitation light for such observation with special light.

Eighth Embodiment

Figure 19A:
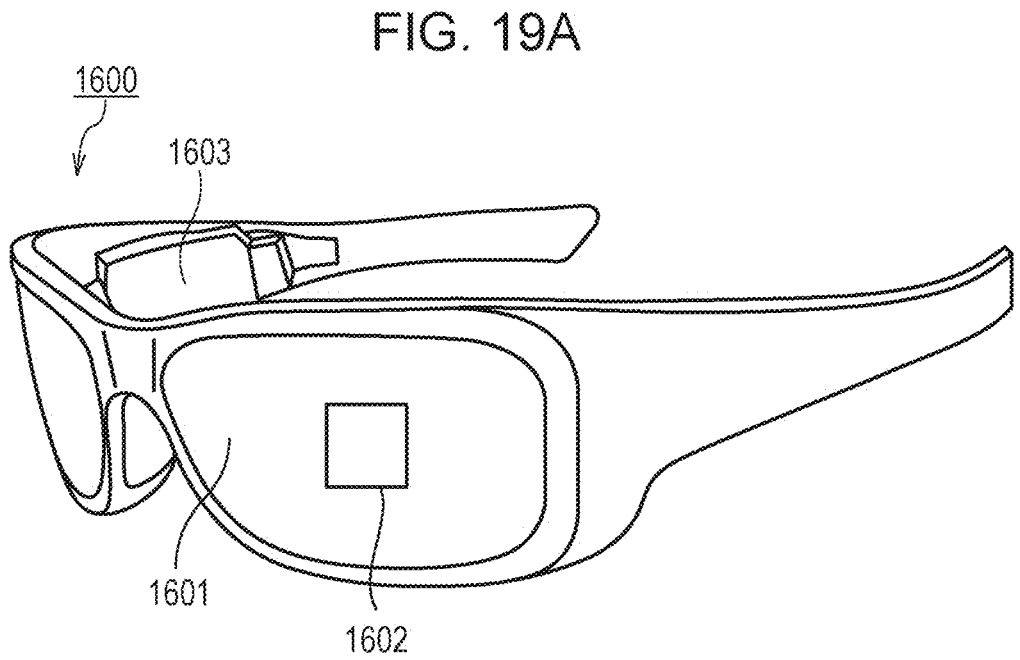
FIGS. 19A and 19B are diagrams illustrating a specific example of a photoelectric conversion system according to an eighth embodiment.

A photoelectric conversion system according to the present embodiment will be described with reference to FIGS. 19A and 19B. FIG. 19A is a diagram illustrating an example of a configuration of eyeglasses 1600 (smart glasses) that are the photoelectric conversion system.

The eyeglasses 1600 include a photoelectric conversion apparatus 1602. The photoelectric conversion apparatus 1602 is the photoelectric conversion apparatus described in the first to third embodiment. A display including a light emitting device such as an OLED or an LED is disposed on a rear surface side of a lens 1601. The eyeglasses 1600 may include one photoelectric conversion apparatus 1602 or a plurality of photoelectric conversion apparatuses 1602. The eyeglasses 1600 may include a plurality of types of photoelectric conversion apparatuses. The arrangement position of the position photoelectric conversion apparatus 1602 is not limited to the position illustrated in FIG. 19A.

The eyeglasses 1600 further include a control device 1603. The control device 1603 functions as a power source that supplies electric power to the photoelectric conversion apparatus 1602 and the above-described display. The control device 1603 controls operations of the photoelectric conversion apparatus 1602 and the display. An optical system that focuses light onto the photoelectric conversion apparatus 1602 is formed on the lens 1601.

Figure 19B:
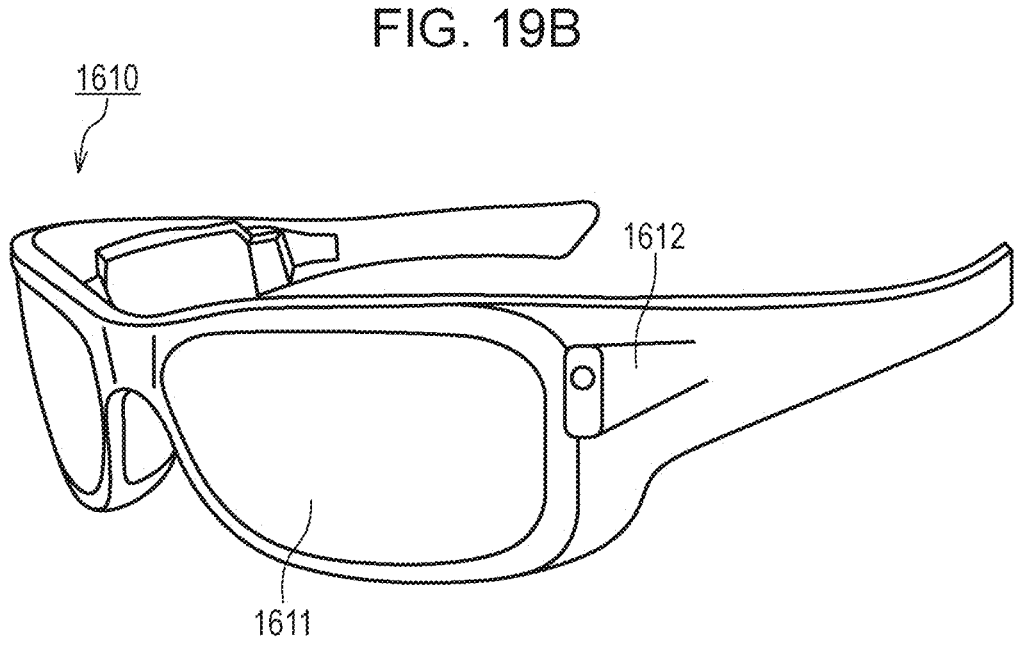

FIG. 19B illustrates eyeglasses 1610 (smart glasses) according to one application example. The eyeglasses 1610 include a control device 1612. In the control device 1612, a photoelectric conversion apparatus corresponding to the photoelectric conversion apparatus 1602, and a display are included. An optical system for projecting light emitted from the display and the photoelectric conversion apparatus within the control device 1612 is formed in the lens 1611 and an image is projected on the lens 1611. The control device 1612 functions as a power source that supplies electric power to the photoelectric conversion apparatus and the display and controls operations of the photoelectric conversion apparatus and the display. The control device may include a line-of-sight detector that detects a line of sight of a person wearing the eyeglasses 1610. Infrared radiation may be used for the detection of the line of sight. An infrared light emitter emits infrared light to the eyeballs of the user gazing at a displayed image. An image capturing unit having a light receiving element detects light reflected from the eyeballs among the emitted infrared light and obtains captured images of the eyeballs. The eyeglasses 1610 include a reduction unit that reduces light emitted from the infrared light emitter toward a display unit in plan view. Therefore, the eyeglasses 1610 reduces a decrease in the image quality.

The line-of-sight detector detects, from the captured images of the eyeballs obtained by image capturing with the infrared light, the line of sight of the user directed to the displayed image. Any known method can be applied to the detection of the line of sight using the captured images of the eyeballs. As an example, a method of detecting a line of sight based on Purkinje images caused by reflection of irradiation light off the corneas can be used.

Specifically, line-of-sight detection based on a pupillary corneal reflex method is performed. The line of sight of the user is detected by using the pupillary corneal reflex method to calculate a line-of-sight vector indicating the orientation (rotation angle) of each eyeball based on images of pupils included in the captured images of the eyeballs and the Purkinje images.

The display according to the present embodiment may include a photoelectric conversion apparatus including a light emitting element and control an image displayed on the display based on information indicating the line of sight of the user and received from the photoelectric conversion apparatus.

Specifically, the display determines, based on the line-of-sight information, a first field-of-view region at which the user gazes, and a second field-of-view region other than the first field-of-view region. The first field-of-view region and the second field-of-view region may be determined by the control device for the display, or the display may receive the first field-of-view region and the second field-of-view region determined by an external control device. In the color gamut of the display, the display resolution of the first line-of-sight region may be controlled to be higher than the display resolution of the second line-of-sight region. That is, the resolution of the second line-of-sight region may be set to be lower than the resolution of the first line-of-sight region.

The color gamut includes a first color gamut and a second color gamut different from the first color gamut. A color gamut with a higher priority out of the first color gamut and the second color gamut may be determined based on the line-of-sight information. The first field-of-view region and the second field-of-view region may be determined by the control device for the display, or the display may receive the first field-of-view region and the second field-of-view region determined by an external control device. The resolution of a region with a higher priority may be controlled to be higher than the resolution of a region other than the region with the higher priority. That is, the resolution of the region with a relatively lower priority may be reduced.

AI may be used to determine the first field-of-view region and the region with the higher priority. The AI may be a model configured to use, as teacher data, images of eyeballs and a direction in which the eyeballs have actually looked to estimate, from the images of the eyeballs, an angle of a line of sight and a distance to a target object to which the line of sight is directed. An AI program may be included in the display, the photoelectric conversion apparatus, or an external device. In a case where the AI program is included in the external device, the AI program is transmitted to the display via communication.

In a case where display and control are performed based on visual recognition and detection, the smart glasses further including a photoelectric conversion apparatus that captures an image of the outside of the smart glasses can be applied to the display and the control. The smart glasses can display information regarding a captured image of the outside of the smart glasses in real time.

The embodiments described above can be appropriately modified without departing from the technical idea of the present disclosure. In addition, an example in which a configuration described in any one of the embodiments is added to one or more of the other embodiments, and an example in which a configuration described in any one of the embodiments is replaced with a configuration described in one or more of the other embodiments are included in the embodiments of the disclosure.

The disclosure of the embodiments includes the following configurations and methods.

Configuration 1

An apparatus including:

a photodiode that performs avalanche multiplication;

a photodiode control circuit including a recharging circuit that switches between a first state in which the photodiode is connected to a power source and a second state in which the photodiode is not connected to the power source, and a control signal generating circuit that generates a control signal to control the recharging circuit;

a count pulse generating circuit that generates a pulse signal from a signal output from the photodiode;

a counter that counts the pulse signal output from the count pulse generating circuit, wherein the control signal generating circuit is configured to output, based on a clock signal and a mask signal, the control signal having a first period and the control signal having a second period longer than the first period, and in a case where a counted value of the counter reaches a threshold, the signal to be output from the control signal generating circuit is switched from the control signal having the first period to the control signal having the second period.

Configuration 2

The apparatus according to Configuration 1, further including a count control circuit that generates a count control signal to be input to the count pulse generating circuit, wherein the count control circuit generates the count control signal based on the clock signal and the mask signal.

Configuration 3

The apparatus according to Configuration 2, wherein in a case where the count control signal is at a first level, the count pulse generating circuit outputs, to the counter, a signal corresponding to the signal output from the photodiode, and in a case where the count control signal is at a second level different from the first level, the count pulse generating circuit does not output, to the counter, the signal corresponding to the signal output from the photodiode.

Configuration 4

The apparatus according to Configuration 2 or 3, wherein the count control circuit includes a selecting circuit, and the selecting circuit is configured to be able to select output of the count control signal and output of the clock signal.

Configuration 5

The apparatus according to Configuration 4, wherein before the counted value of the counter reaches the threshold, the selecting circuit outputs the clock signal.

Configuration 6

The apparatus according to any one of Configurations 1 to 5, wherein the control signal generating circuit is configured to be able to output, based on the clock signal and the mask signal, the control signal having the second period and the control signal having a third period longer than the second period, and in a case where the counted value of the counter reaches another threshold indicating a larger value than the threshold, the signal to be output from the control signal generating circuit is switched from the control signal having the second period to the control signal having the third period.

Configuration 7

The apparatus according to any one of Configurations 1 to 6, further including a correction unit that corrects the counted value based on the first period and the second period in a case where the counted value of the counter reaches the threshold.

Configuration 8

The apparatus according to any one of Configurations 1 to 7, further including a mask signal generating circuit that generates the mask signal.

Configuration 9

The apparatus according to Configuration 8, further including a plurality of pixels each including the photodiode, the photodiode control circuit, the count pulse generating circuit, and the counter, wherein the mask signal generating circuit is disposed in each of the plurality of pixels.

Configuration 10

The apparatus according to Configuration 8, further including a plurality of pixels each including the photodiode, the photodiode control circuit, the count pulse generating circuit, and the counter, wherein the mask signal generating circuit is provided in common for the plurality of pixels.

Configuration 11

A system including:

the apparatus according to any one of Configurations 1 to 10; and a processing unit that generates an image using a signal output from the apparatus.

Configuration 12

A moving object including:

the apparatus according to any one of Configurations 1 to 10; and a control unit that controls movement of the moving object using a signal output from the apparatus.

According to the aspect of the embodiments, it is possible to provide a photoelectric conversion apparatus that has a wider dynamic range and has a low power consumption function even under a high-illuminance environment.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2023-138000, filed Aug. 28, 2023, which is hereby incorporated by reference herein in its entirety.

What is claimed is:

1. An apparatus comprising:
a photodiode that performs avalanche multiplication;
a photodiode control circuit including a recharging circuit that switches between a first state in which the photodiode is connected to a power source and a second state in which the photodiode is not connected to the power source, and a control signal generating circuit that generates a control signal to control the recharging circuit;
a count pulse generating circuit that generates a pulse signal from a signal output from the photodiode;
a count control circuit that generates a count control signal to be input to the count pulse generating circuit; and
a counter that counts the pulse signal output from the count pulse generating circuit, wherein
the control signal generating circuit is configured to output, based on a clock signal and a mask signal, the control signal having a first period and the control signal having a second period longer than the first period,
in a case where a counted value of the counter reaches a threshold, the signal to be output from the control signal generating circuit is switched from the control signal having the first period to the control signal having the second period, and
the count control circuit generates the count control signal based on the clock signal and the mask signal.

2. The apparatus according to claim 1, wherein
in a case where the count control signal is at a first level, the count pulse generating circuit outputs, to the counter, a signal corresponding to the signal output from the photodiode, and
in a case where the count control signal is at a second level different from the first level, the count pulse generating circuit does not output, to the counter, the signal corresponding to the signal output from the photodiode.

3. The apparatus according to claim 1, wherein
the count control circuit includes a selecting circuit, and
the selecting circuit is configured to be able to select output of the count control signal and output of the clock signal.

4. The apparatus according to claim 3, wherein
before the counted value of the counter reaches the threshold, the selecting circuit outputs the clock signal.

5. The apparatus according to claim 1, wherein
the control signal generating circuit is configured to be able to output, based on the clock signal and the mask signal, the control signal having the second period and the control signal having a third period longer than the second period, and
in a case where the counted value of the counter reaches another threshold indicating a larger value than the threshold, the signal to be output from the control signal generating circuit is switched from the control signal having the second period to the control signal having the third period.

6. The apparatus according to claim 1, further comprising
a correction unit that corrects the counted value based on the first period and the second period in a case where the counted value of the counter reaches the threshold.

7. The apparatus according to claim 1, further comprising a mask signal generating circuit that generates the mask signal.

8. The apparatus according to claim 7, further comprising a plurality of pixels each including the photodiode, the photodiode control circuit, the count pulse generating circuit, and the counter,
wherein the mask signal generating circuit is disposed in each of the plurality of pixels.

9. The apparatus according to claim 7, further comprising a plurality of pixels each including the photodiode, the photodiode control circuit, the count pulse generating circuit, and the counter, wherein
the mask signal generating circuit is provided in common for the plurality of pixels.

10. A system comprising:
the apparatus according to claim 1; and
a processing unit that generates an image using a signal output from the apparatus.

11. The system according to claim 10, wherein, in the apparatus,
in a case where the count control signal is at a first level, the count pulse generating circuit outputs, to the counter, a signal corresponding to the signal output from the photodiode, and
in a case where the count control signal is at a second level different from the first level, the count pulse generating circuit does not output, to the counter, the signal corresponding to the signal output from the photodiode.

12. The system according to claim 10, wherein, in the apparatus,
the count control circuit includes a selecting circuit, and
the selecting circuit is configured to be able to select output of the count control signal and output of the clock signal.

13. The system according to claim 10, wherein, in the apparatus,
the control signal generating circuit is configured to be able to output, based on the clock signal and the mask signal, the control signal having the second period and the control signal having a third period longer than the second period, and
in a case where the counted value of the counter reaches another threshold indicating a larger value than the threshold, the signal to be output from the control signal generating circuit is switched from the control signal having the second period to the control signal having the third period.

14. The system according to claim 10, further comprising a correction unit that corrects the counted value based on the first period and the second period in a case where the counted value of the counter reaches the threshold.

15. A moving object comprising:
the apparatus according to claim 1; and
a control unit that controls movement of the moving object using a signal output from the apparatus.

16. The moving object according to claim 15, wherein, in the apparatus,
in a case where the count control signal is at a first level, the count pulse generating circuit outputs, to the counter, a signal corresponding to the signal output from the photodiode, and
in a case where the count control signal is at a second level different from the first level, the count pulse generating circuit does not output, to the counter, the signal corresponding to the signal output from the photodiode.

17. The moving object according to claim 15, wherein, in the apparatus, the count control circuit includes a selecting circuit, and the selecting circuit is configured to be able to select output of the count control signal and output of the clock signal.

18. The moving object according to claim 15, wherein, in the apparatus, the control signal generating circuit is configured to be able to output, based on the clock signal and the mask signal, the control signal having the second period and the control signal having a third period longer than the second period, and in a case where the counted value of the counter reaches another threshold indicating a larger value than the threshold, the signal to be output from the control signal generating circuit is switched from the control signal having the second period to the control signal having the third period.

19. The moving object according to claim 15, further comprising a correction unit that corrects the counted value based on the first period and the second period in a case where the counted value of the counter reaches the threshold.

\*     \*     \*     \*     \*